(12) United States Patent
Han et al.

(10) Patent No.: US 11,943,937 B2
(45) Date of Patent: Mar. 26, 2024

(54) MEMORY CELL AND MEMORY ARRAY SELECT TRANSISTOR

(71) Applicant: Zeno Semiconductor, Inc., Sunnyvale, CA (US)

(72) Inventors: Jin-Woo Han, San Jose, CA (US); Yuniarto Widjaja, Cupertino, CA (US)

(73) Assignee: Zeno Semiconductor Inc., Sunnyvale, CA (US)

( * ) Notice: Subject to any disclaimer, the term of this patent is extended or adjusted under 35 U.S.C. 154(b) by 0 days.

(21) Appl. No.: 18/171,497

(22) Filed: Feb. 20, 2023

(65) Prior Publication Data

US 2023/0217663 A1 Jul. 6, 2023

Related U.S. Application Data

(63) Continuation of application No. 16/740,652, filed on Jan. 13, 2020, now Pat. No. 11,600,663.

(60) Provisional application No. 62/933,880, filed on Nov. 11, 2019, provisional application No. 62/817,484, filed on Mar. 12, 2019, provisional application No. 62/791,537, filed on Jan. 11, 2019.

(51) Int. Cl.
*H10B 63/00* (2023.01)
*H10B 41/00* (2023.01)
*H10B 61/00* (2023.01)

(52) U.S. Cl.
CPC ............. *H10B 63/34* (2023.02); *H10B 41/00* (2023.02); *H10B 61/22* (2023.02); *H10B 63/32* (2023.02); *H10B 63/84* (2023.02)

(58) Field of Classification Search
CPC ........... H01L 29/1095; H01L 27/11524; H01L 27/11529; H01L 27/1157; H01L 29/42328; H01L 29/42344; H01L 29/1083; H10B 41/35; H10B 41/41; H10B 43/35

See application file for complete search history.

(56) References Cited

U.S. PATENT DOCUMENTS

| | | |
|---|---|---|
| 4,300,212 A | 11/1981 | Simko |
| 4,959,812 A | 9/1990 | Momodomi et al. |
| 4,975,764 A | 12/1990 | Hsu |
| 5,304,833 A | 4/1994 | Shigeki et al. |
| 5,365,477 A | 11/1994 | Cooper, Jr. et al. |
| 5,465,249 A | 11/1995 | Cooper, Jr. et al. |
| 5,519,831 A | 5/1996 | Holzhammer |
| 5,581,504 A | 12/1996 | Chang |
| 5,767,549 A | 6/1998 | Chen et al. |
| 5,999,444 A | 12/1999 | Fujiwara et al. |
| 6,005,818 A | 12/1999 | Ferrant et al. |
| 6,141,248 A | 10/2000 | Forbes et al. |

(Continued)

OTHER PUBLICATIONS

Almeida, et al., "Comparison between low and high read bias in FB-RAM on UTBOX FDSOI devices", Ultimate Integration on Silicon (ULIS), 2012 13th International Conference on, Mar. 6, 2012, pp. 61-64.

(Continued)

*Primary Examiner* — Amar Movva
(74) *Attorney, Agent, or Firm* — Law Office of Alan W. Cannon

(57) ABSTRACT

A semiconductor metal-oxide-semiconductor field effect transistor (MOSFET) with increased on-state current obtained through a parasitic bipolar junction transistor (BJT) of the MOSFET. Methods of operating the MOSFET as a memory cell or a memory array select transistor are provided.

17 Claims, 32 Drawing Sheets

(56) References Cited

U.S. PATENT DOCUMENTS

| | | |
|---|---|---|
| 6,163,048 A | 12/2000 | Hirose et al. |
| 6,166,407 A | 12/2000 | Ohta |
| 6,277,689 B1 | 8/2001 | Wong |
| 6,341,087 B1 | 1/2002 | Kunikiyo et al. |
| 6,356,485 B1 | 3/2002 | Proebsting et al. |
| 6,376,876 B1 | 4/2002 | Shin et al. |
| 6,433,391 B1 | 8/2002 | En et al. |
| 6,542,411 B2 | 4/2003 | Tanikawa et al. |
| 6,614,684 B1 | 9/2003 | Shukuri et al. |
| 6,661,042 B2 | 12/2003 | Hsu |
| 6,686,624 B2 | 2/2004 | Hsu |
| 6,724,657 B2 | 4/2004 | Shukuri et al. |
| 6,791,882 B2 | 9/2004 | Seki et al. |
| 6,801,452 B2 | 10/2004 | Miwa et al. |
| 6,835,979 B1 | 12/2004 | Liu et al. |
| 6,885,581 B2 | 4/2005 | Nemati et al. |
| 6,913,964 B2 | 7/2005 | Hsu |
| 6,925,006 B2 | 8/2005 | Fazan et al. |
| 6,954,377 B2 | 10/2005 | Choi et al. |
| 6,969,662 B2 | 11/2005 | Fazan et al. |
| 7,030,435 B2 | 4/2006 | Gnadinger |
| 7,085,156 B2 | 8/2006 | Ferrant et al. |
| 7,118,986 B2 | 10/2006 | Steigerwalt et al. |
| 7,170,807 B2 | 1/2007 | Fazan et al. |
| 7,208,795 B2 | 4/2007 | Carver et al. |
| 7,224,019 B2 | 5/2007 | Hieda et al. |
| 7,259,420 B2 | 8/2007 | Anderson et al. |
| 7,259,992 B2 | 8/2007 | Shirota |
| 7,285,820 B2 | 10/2007 | Park et al. |
| 7,301,803 B2 | 11/2007 | Okhonin et al. |
| 7,329,580 B2 | 2/2008 | Cho et al. |
| 7,376,006 B2 | 5/2008 | Bednorz et al. |
| 7,440,333 B2 | 10/2008 | Hsia et al. |
| 7,447,068 B2 | 11/2008 | Tsai et al. |
| 7,450,423 B2 | 11/2008 | Lai et al. |
| 7,473,611 B2 | 1/2009 | Cho et al. |
| 7,504,302 B2 | 3/2009 | Mathew et al. |
| 7,541,636 B2 | 6/2009 | Ranica et al. |
| 7,542,345 B2 | 6/2009 | Okhonin et al. |
| 7,579,241 B2 | 8/2009 | Hieda et al. |
| 7,609,551 B2 | 10/2009 | Shino et al. |
| 7,622,761 B2 | 11/2009 | Park et al. |
| 7,701,763 B2 | 4/2010 | Roohparvar |
| 7,733,693 B2 | 6/2010 | Ferrant et al. |
| 7,759,715 B2 | 7/2010 | Bhattacharyya |
| 7,760,548 B2 | 7/2010 | Widjaja |
| 7,847,338 B2 | 12/2010 | Widjaja |
| 7,924,630 B2 | 4/2011 | Carman |
| 7,933,140 B2 | 4/2011 | Wang et al. |
| 8,014,200 B2 | 9/2011 | Widjaja |
| 8,036,033 B2 | 10/2011 | Widjaja |
| 8,059,459 B2 | 11/2011 | Widjaja |
| 8,077,536 B2 | 12/2011 | Widjaja |
| 8,130,547 B2 | 3/2012 | Widjaja et al. |
| 8,130,548 B2 | 3/2012 | Widjaja et al. |
| 8,159,878 B2 | 4/2012 | Widjaja |
| 8,174,886 B2 | 5/2012 | Widjaja et al. |
| 8,194,451 B2 | 6/2012 | Widjaja |
| 8,208,302 B2 | 6/2012 | Widjaja et al. |
| 8,243,499 B2 | 8/2012 | Widjaja |
| 8,294,193 B2 | 10/2012 | Widjaja |
| 8,391,066 B2 | 3/2013 | Widjaja |
| 8,472,249 B2 | 6/2013 | Widjaja |
| 8,514,622 B2 | 8/2013 | Widjaja |
| 8,514,623 B2 | 8/2013 | Widjaja et al. |
| 8,531,881 B2 | 9/2013 | Widjaja |
| 8,559,257 B2 | 10/2013 | Widjaja |
| 8,570,803 B2 | 10/2013 | Widjaja |
| 8,582,359 B2 | 11/2013 | Widjaja |
| 8,654,583 B2 | 2/2014 | Widjaja |
| 8,711,622 B2 | 4/2014 | Widjaja |
| 8,767,458 B2 | 7/2014 | Widjaja |
| 8,787,085 B2 | 7/2014 | Widjaja |
| 8,837,247 B2 | 9/2014 | Widjaja |
| 8,923,052 B2 | 12/2014 | Widjaja |
| 8,934,296 B2 | 1/2015 | Widjaja |
| 8,937,834 B2 | 1/2015 | Widjaja et al. |
| 8,957,458 B2 | 2/2015 | Widjaja |
| 8,995,186 B2 | 3/2015 | Widjaja |
| 9,001,581 B2 | 4/2015 | Widjaja |
| 9,025,358 B2 | 5/2015 | Widjaja |
| 9,029,922 B2 | 5/2015 | Han et al. |
| 9,030,872 B2 | 5/2015 | Widjaja et al. |
| 9,087,580 B2 | 7/2015 | Widjaja |
| 9,153,309 B2 | 10/2015 | Widjaja et al. |
| 9,153,333 B2 | 10/2015 | Widjaja |
| 9,208,840 B2 | 12/2015 | Widjaja et al. |
| 9,208,880 B2 | 12/2015 | Louie et al. |
| 9,209,188 B2 | 12/2015 | Widjaja |
| 9,230,651 B2 | 1/2016 | Widjaja et al. |
| 9,230,965 B2 | 1/2016 | Widjaja |
| 9,236,382 B2 | 1/2016 | Widjaja et al. |
| 9,257,179 B2 | 2/2016 | Widjaja |
| 9,275,723 B2 | 3/2016 | Louie et al. |
| 9,281,022 B2 | 3/2016 | Louie et al. |
| 9,368,625 B2 | 6/2016 | Louie et al. |
| 9,391,079 B2 | 7/2016 | Widjaja |
| 9,401,206 B2 | 7/2016 | Widjaja |
| 9,431,401 B2 | 8/2016 | Han et al. |
| 9,455,262 B2 | 9/2016 | Widjaja |
| 9,460,790 B2 | 10/2016 | Widjaja |
| 9,484,082 B2 | 11/2016 | Widjaja |
| 9,490,012 B2 | 11/2016 | Widjaja |
| 9,496,053 B2 | 11/2016 | Tan et al. |
| 9,514,803 B2 | 12/2016 | Widjaja et al. |
| 9,524,970 B2 | 12/2016 | Widjaja |
| 9,536,595 B2 | 1/2017 | Louie et al. |
| 9,548,119 B2 | 1/2017 | Han et al. |
| 9,576,962 B2 | 2/2017 | Widjaja et al. |
| 9,589,963 B2 | 3/2017 | Widjaja |
| 9,601,493 B2 | 3/2017 | Widjaja |
| 9,614,080 B2 | 4/2017 | Widjaja |
| 9,646,693 B2 | 5/2017 | Widjaja |
| 9,653,467 B2 | 5/2017 | Widjaja et al. |
| 9,666,275 B2 | 5/2017 | Widjaja |
| 9,679,648 B2 | 6/2017 | Widjaja |
| 9,704,578 B2 | 7/2017 | Louie et al. |
| 9,704,870 B2 | 7/2017 | Widjaja |
| 9,715,932 B2 | 7/2017 | Widjaja |
| 9,747,983 B2 | 8/2017 | Widjaja |
| 9,761,311 B2 | 9/2017 | Widjaja |
| 9,761,589 B2 | 9/2017 | Widjaja |
| 9,793,277 B2 | 10/2017 | Widjaja et al. |
| 9,799,392 B2 | 10/2017 | Han et al. |
| 9,812,203 B2 | 11/2017 | Widjaja |
| 9,812,456 B2 | 11/2017 | Widjaja |
| 9,831,247 B2 | 11/2017 | Han et al. |
| 9,847,131 B2 | 12/2017 | Widjaja |
| 9,865,332 B2 | 1/2018 | Louie et al. |
| 9,881,667 B2 | 1/2018 | Han et al. |
| 9,893,067 B2 | 2/2018 | Widjaja et al. |
| 9,905,564 B2 | 2/2018 | Widjaja et al. |
| 9,922,711 B2 | 3/2018 | Widjaja |
| 9,922,981 B2 | 3/2018 | Widjaja |
| 9,928,910 B2 | 3/2018 | Widjaja |
| 9,947,387 B2 | 4/2018 | Louie et al. |
| 9,960,166 B2 | 5/2018 | Widjaja |
| 9,978,450 B2 | 5/2018 | Widjaja |
| 10,008,266 B1 | 6/2018 | Widjaja |
| 10,026,479 B2 | 7/2018 | Louie et al. |
| 10,032,514 B2 | 7/2018 | Widjaja |
| 10,032,776 B2 | 7/2018 | Widjaja et al. |
| 10,056,387 B2 | 8/2018 | Widjaja |
| 10,074,653 B2 | 9/2018 | Widjaja |
| 10,079,236 B2 | 9/2018 | Widjaja |
| 10,079,301 B2 | 9/2018 | Han et al. |
| 10,103,148 B2 | 10/2018 | Louie et al. |
| 10,103,149 B2 | 10/2018 | Han et al. |
| 10,109,349 B2 | 10/2018 | Widjaja |
| 10,115,451 B2 | 10/2018 | Han et al. |
| 10,141,046 B2 | 11/2018 | Han et al. |
| 10,141,315 B2 | 11/2018 | Widjaja et al. |
| 10,157,663 B2 | 12/2018 | Louie et al. |
| 10,163,907 B2 | 12/2018 | Widjaja et al. |

(56) References Cited

U.S. PATENT DOCUMENTS

| | | |
|---|---|---|
| 10,181,471 B2 | 1/2019 | Widjaja et al. |
| 10,192,872 B2 | 1/2019 | Widjaja et al. |
| 10,204,684 B2 | 2/2019 | Widjaja |
| 10,204,908 B2 | 2/2019 | Widjaja |
| 10,210,934 B2 | 2/2019 | Widjaja |
| 10,211,209 B2 | 2/2019 | Widjaja |
| 10,242,739 B2 | 3/2019 | Widjaja |
| 10,249,368 B2 | 4/2019 | Widjaja |
| 10,340,006 B2 | 7/2019 | Widjaja |
| 10,340,276 B2 | 7/2019 | Widjaja et al. |
| 10,347,636 B2 | 7/2019 | Widjaja |
| 10,354,718 B2 | 7/2019 | Louie et al. |
| 10,373,685 B2 | 8/2019 | Louie et al. |
| 10,388,378 B2 | 8/2019 | Widjaja |
| 10,403,361 B2 | 9/2019 | Widjaja |
| 10,453,847 B2 | 10/2019 | Widjaja et al. |
| 10,461,083 B2 | 10/2019 | Han et al. |
| 10,461,084 B2 | 10/2019 | Widjaja |
| 10,468,102 B2 | 11/2019 | Widjaja |
| 10,497,443 B2 | 12/2019 | Widjaja |
| 10,504,585 B2 | 12/2019 | Louie et al. |
| 10,515,968 B2 | 12/2019 | Widjaja |
| 10,522,213 B2 | 12/2019 | Han et al. |
| 10,529,424 B2 | 1/2020 | Widjaja |
| 10,529,853 B2 | 1/2020 | Han et al. |
| 10,546,860 B2 | 1/2020 | Louie et al. |
| 10,553,281 B2 | 2/2020 | Widjaja |
| 10,553,683 B2 | 2/2020 | Han et al. |
| 10,580,482 B2 | 3/2020 | Han et al. |
| 10,593,675 B2 | 3/2020 | Widjaja et al. |
| 10,615,163 B2 | 4/2020 | Widjaja |
| 10,622,069 B2 | 4/2020 | Widjaja |
| 10,629,599 B2 | 4/2020 | Widjaja et al. |
| 10,644,001 B2 | 5/2020 | Widjaja et al. |
| 10,644,002 B2 | 5/2020 | Widjaja |
| 10,707,209 B2 | 7/2020 | Widjaja |
| 10,734,076 B2 | 8/2020 | Widjaja |
| 10,748,904 B2 | 8/2020 | Widjaja et al. |
| 10,783,952 B2 | 9/2020 | Louie et al. |
| 10,797,055 B2 | 10/2020 | Widjaja et al. |
| 10,804,276 B2 | 10/2020 | Widjaja |
| 10,818,354 B2 | 10/2020 | Widjaja |
| 10,825,520 B2 | 11/2020 | Widjaja |
| 10,839,905 B2 | 11/2020 | Louie et al. |
| 10,854,745 B2 | 12/2020 | Han et al. |
| 10,861,548 B2 | 12/2020 | Widjaja |
| 10,867,676 B2 | 12/2020 | Widjaja |
| 10,916,297 B2 | 2/2021 | Han et al. |
| 10,923,183 B2 | 2/2021 | Han et al. |
| 10,978,455 B2 | 4/2021 | Widjaja et al. |
| 10,991,697 B2 | 4/2021 | Louie et al. |
| 10,991,698 B2 | 4/2021 | Widjaja |
| 11,004,512 B2 | 5/2021 | Widjaja |
| 11,011,232 B2 | 5/2021 | Widjaja |
| 11,018,136 B2 | 5/2021 | Widjaja et al. |
| 11,031,401 B2 | 6/2021 | Han et al. |
| 11,037,929 B2 | 6/2021 | Widjaja |
| 11,063,048 B2 | 7/2021 | Widjaja |
| 11,100,994 B2 | 8/2021 | Louie et al. |
| 11,133,313 B2 | 9/2021 | Widjaja |
| 11,183,498 B2 | 11/2021 | Widjaja et al. |
| 11,201,215 B2 | 12/2021 | Han et al. |
| 11,211,125 B2 | 12/2021 | Widjaja |
| 11,217,300 B2 | 1/2022 | Louie et al. |
| 11,250,905 B2 | 2/2022 | Han et al. |
| 11,295,813 B2 | 4/2022 | Widjaja |
| 11,328,765 B2 | 5/2022 | Han et al. |
| 11,342,018 B2 | 5/2022 | Louie et al. |
| 11,348,922 B2 | 5/2022 | Widjaja et al. |
| 11,348,923 B2 | 5/2022 | Widjaja |
| 11,404,419 B2 | 8/2022 | Widjaja et al. |
| 11,404,420 B2 | 8/2022 | Widjaja |
| 11,417,657 B2 | 8/2022 | Widjaja et al. |
| 11,417,658 B2 | 8/2022 | Louie et al. |
| 11,488,665 B2 | 11/2022 | Widjaja |
| 11,488,955 B2 | 11/2022 | Widjaja |
| 11,489,073 B2 | 11/2022 | Han et al. |
| 11,545,217 B2 | 1/2023 | Widjaja |
| 11,551,754 B2 | 1/2023 | Widjaja |
| 11,594,280 B2 | 2/2023 | Louie et al. |
| 11,600,663 B2 | 3/2023 | Han et al. |
| 2002/0018366 A1 | 2/2002 | Von Schwerin et al. |
| 2002/0048193 A1 | 4/2002 | Tanikawa et al. |
| 2005/0024968 A1 | 2/2005 | Lee et al. |
| 2005/0032313 A1 | 2/2005 | Forbes |
| 2005/0124120 A1 | 6/2005 | Du et al. |
| 2006/0044915 A1 | 3/2006 | Park et al. |
| 2006/0125010 A1 | 6/2006 | Bhattacharyya |
| 2006/0157679 A1 | 7/2006 | Scheuerlein |
| 2006/0227601 A1 | 10/2006 | Bhattacharyya |
| 2006/0237770 A1 | 10/2006 | Huang et al. |
| 2006/0278915 A1 | 12/2006 | Lee et al. |
| 2007/0004149 A1 | 1/2007 | Tews |
| 2007/0090443 A1 | 4/2007 | Choi et al. |
| 2007/0164351 A1 | 7/2007 | Hamamoto |
| 2007/0164352 A1 | 7/2007 | Padilla |
| 2007/0210338 A1 | 9/2007 | Orlowski |
| 2007/0215954 A1 | 9/2007 | Mouli |
| 2007/0284648 A1 | 12/2007 | Park et al. |
| 2008/0048239 A1 | 2/2008 | Huo et al. |
| 2008/0080248 A1 | 4/2008 | Lue et al. |
| 2008/0123418 A1 | 5/2008 | Widjaja |
| 2008/0224202 A1 | 9/2008 | Young et al. |
| 2008/0265305 A1 | 10/2008 | He et al. |
| 2008/0303079 A1 | 12/2008 | Cho et al. |
| 2009/0034320 A1 | 2/2009 | Ueda |
| 2009/0065853 A1 | 3/2009 | Hanafi |
| 2009/0081835 A1 | 3/2009 | Kim et al. |
| 2009/0085089 A1 | 4/2009 | Chang et al. |
| 2009/0108322 A1 | 4/2009 | Widjaja |
| 2009/0108351 A1 | 4/2009 | Yang et al. |
| 2009/0109750 A1 | 4/2009 | Widjaja |
| 2009/0173985 A1 | 7/2009 | Lee et al. |
| 2009/0190402 A1 | 7/2009 | Hsu et al. |
| 2009/0251966 A1 | 10/2009 | Widjaja |
| 2009/0316492 A1 | 12/2009 | Widjaja |
| 2010/0008139 A1 | 1/2010 | Bae |
| 2010/0034041 A1 | 2/2010 | Widjaja |
| 2010/0046287 A1 | 2/2010 | Widjaja |
| 2010/0246277 A1 | 9/2010 | Widjaja |
| 2010/0246284 A1 | 9/2010 | Widjaja |
| 2011/0032756 A1 | 2/2011 | Widjaja |
| 2011/0042736 A1 | 2/2011 | Widjaja |
| 2011/0044110 A1 | 2/2011 | Widjaja |
| 2011/0228591 A1 | 9/2011 | Widjaja |
| 2011/0305085 A1 | 12/2011 | Widjaja |
| 2012/0012915 A1 | 1/2012 | Widjaja et al. |
| 2012/0014180 A1 | 1/2012 | Widjaja |
| 2012/0014188 A1 | 1/2012 | Widjaja et al. |
| 2012/0069652 A1 | 3/2012 | Widjaja |
| 2012/0106234 A1 | 5/2012 | Widjaja |
| 2012/0113712 A1 | 5/2012 | Widjaja |
| 2012/0120752 A1 | 5/2012 | Widjaja |
| 2012/0217549 A1 | 8/2012 | Widjaja |
| 2012/0230123 A1 | 9/2012 | Widjaja et al. |
| 2013/0015517 A1 | 1/2013 | Widjaja et al. |
| 2013/0148422 A1 | 6/2013 | Widjaja |
| 2013/0250685 A1 | 9/2013 | Widjaja |
| 2013/0264656 A1 | 10/2013 | Widjaja et al. |
| 2013/0292635 A1 | 11/2013 | Widjaja |
| 2013/0301349 A1 | 11/2013 | Widjaja |
| 2014/0021549 A1 | 1/2014 | Widjaja |
| 2014/0159156 A1 | 6/2014 | Widjaja |
| 2014/0160868 A1 | 6/2014 | Widjaja et al. |
| 2014/0198551 A1 | 7/2014 | Louie et al. |
| 2014/0307501 A1 | 10/2014 | Louie et al. |
| 2014/0328128 A1 | 11/2014 | Louie et al. |
| 2014/0332899 A1 | 11/2014 | Widjaja |
| 2014/0340972 A1 | 11/2014 | Widjaja et al. |
| 2014/0355343 A1 | 12/2014 | Widjaja |
| 2015/0016207 A1 | 1/2015 | Louie et al. |
| 2015/0023105 A1 | 1/2015 | Widjaja et al. |
| 2015/0092486 A1 | 4/2015 | Widjaja |
| 2015/0109860 A1 | 4/2015 | Widjaja |

(56) References Cited

U.S. PATENT DOCUMENTS

| | | |
|---|---|---|
| 2015/0155284 A1 | 6/2015 | Widjaja |
| 2015/0170743 A1 | 6/2015 | Widjaja |
| 2015/0187776 A1 | 7/2015 | Widjaja |
| 2015/0200005 A1 | 7/2015 | Han et al. |
| 2015/0213892 A1 | 7/2015 | Widjaja |
| 2015/0221650 A1 | 8/2015 | Widjaja et al. |
| 2015/0221653 A1 | 8/2015 | Han et al. |
| 2015/0310917 A1 | 10/2015 | Widjaja |
| 2015/0371707 A1 | 12/2015 | Widjaja |
| 2016/0005741 A1 | 1/2016 | Widjaja |
| 2016/0005750 A1 | 1/2016 | Widjaja |
| 2016/0049190 A1 | 2/2016 | Han et al. |
| 2016/0078921 A1 | 3/2016 | Widjaja et al. |
| 2016/0086655 A1 | 3/2016 | Widjaja |
| 2016/0086954 A1 | 3/2016 | Widjaja et al. |
| 2016/0111158 A1 | 4/2016 | Widjaja |
| 2016/0148674 A1 | 5/2016 | Louie et al. |
| 2016/0148675 A1 | 5/2016 | Louie et al. |
| 2016/0267982 A1 | 9/2016 | Louie et al. |
| 2016/0300613 A1 | 10/2016 | Widjaja |
| 2016/0300841 A1 | 10/2016 | Widjaja |
| 2016/0176248 A1 | 11/2016 | Han et al. |
| 2016/0336326 A1 | 11/2016 | Han et al. |
| 2016/0365444 A1 | 12/2016 | Widjaja |
| 2017/0025164 A1 | 1/2017 | Han et al. |
| 2017/0025534 A1 | 1/2017 | Widjaja |
| 2017/0032842 A1 | 2/2017 | Widjaja |
| 2017/0040326 A1 | 2/2017 | Widjaja |
| 2017/0053919 A1 | 2/2017 | Widjaja et al. |
| 2017/0076784 A1 | 3/2017 | Louie et al. |
| 2017/0092351 A1 | 3/2017 | Han et al. |
| 2017/0092359 A1 | 3/2017 | Louie et al. |
| 2017/0092648 A1 | 3/2017 | Widjaja |
| 2017/0125421 A1 | 5/2017 | Widjaja et al. |
| 2017/0133091 A1 | 5/2017 | Widjaja |
| 2017/0133382 A1 | 5/2017 | Widjaja |
| 2017/0154888 A1 | 6/2017 | Widjaja |
| 2017/0169887 A1 | 6/2017 | Widjaja |
| 2017/0213593 A1 | 7/2017 | Widjaja |
| 2017/0221900 A1 | 8/2017 | Widjaja et al. |
| 2017/0229178 A1 | 8/2017 | Widjaja |
| 2017/0229466 A1 | 8/2017 | Widjaja et al. |
| 2017/0271339 A1 | 9/2017 | Widjaja |
| 2017/0294230 A1 | 10/2017 | Widjaja |
| 2017/0294438 A1 | 10/2017 | Louie et al. |
| 2017/0365340 A1 | 12/2017 | Widjaja |
| 2017/0365607 A1 | 12/2017 | Widjaja |
| 2018/0012646 A1 | 1/2018 | Han et al. |
| 2018/0012893 A1 | 1/2018 | Widjaja et al. |
| 2018/0025780 A1 | 1/2018 | Widjaja |
| 2018/0047731 A1 | 2/2018 | Widjaja |
| 2018/0069008 A1 | 3/2018 | Han et al. |
| 2018/0075907 A1 | 3/2018 | Widjaja |
| 2018/0096721 A1 | 4/2018 | Louie et al. |
| 2018/0122457 A1 | 5/2018 | Han et al. |
| 2018/0122943 A1 | 5/2018 | Han et al. |
| 2018/0158825 A1 | 6/2018 | Widjaja et al. |
| 2018/0158912 A1 | 6/2018 | Han et al. |
| 2018/0166446 A1 | 6/2018 | Widjaja |
| 2018/0174654 A1 | 6/2018 | Widjaja |
| 2018/0182458 A1 | 6/2018 | Widjaja |
| 2018/0182460 A1 | 6/2018 | Widjaja |
| 2018/0204611 A1 | 7/2018 | Louie et al. |
| 2018/0219013 A1 | 8/2018 | Widjaja |
| 2018/0233199 A1 | 8/2018 | Widjaja |
| 2018/0301191 A1 | 10/2018 | Widjaja |
| 2018/0301192 A1 | 10/2018 | Louie et al. |
| 2018/0308848 A1 | 10/2018 | Widjaja et al. |
| 2018/0330790 A1 | 11/2018 | Widjaja |
| 2018/0331109 A1 | 11/2018 | Widjaja |
| 2018/0358360 A1 | 12/2018 | Han et al. |
| 2018/0374854 A1 | 12/2018 | Widjaja |
| 2019/0006367 A1 | 1/2019 | Widjaja |
| 2019/0006516 A1 | 1/2019 | Han et al. |
| 2019/0027220 A1 | 1/2019 | Widjaja |
| 2019/0027476 A1 | 1/2019 | Louie et al. |
| 2019/0043554 A1 | 2/2019 | Han et al. |
| 2019/0066768 A1 | 2/2019 | Han et al. |
| 2019/0067289 A1 | 2/2019 | Widjaja et al. |
| 2019/0080746 A1 | 3/2019 | Louie et al. |
| 2019/0096889 A1 | 3/2019 | Widjaja et al. |
| 2019/0131305 A1 | 5/2019 | Widjaja et al. |
| 2019/0139962 A1 | 5/2019 | Widjaja |
| 2019/0148381 A1 | 5/2019 | Widjaja et al. |
| 2019/0156889 A1 | 5/2019 | Widjaja |
| 2019/0156890 A1 | 5/2019 | Widjaja |
| 2019/0164974 A1 | 5/2019 | Widjaja |
| 2019/0180820 A1 | 6/2019 | Widjaja |
| 2019/0189212 A1 | 6/2019 | Widjaja |
| 2019/0259763 A1 | 8/2019 | Widjaja et al. |
| 2019/0267089 A1 | 8/2019 | Widjaja |
| 2019/0267382 A1 | 8/2019 | Widjaja |
| 2019/0295629 A1 | 9/2019 | Louie et al. |
| 2019/0295646 A1 | 9/2019 | Widjaja |
| 2019/0311769 A1 | 10/2019 | Louie et al. |
| 2019/0355419 A1 | 11/2019 | Widjaja |
| 2020/0013780 A1 | 1/2020 | Widjaja |
| 2020/0013781 A1 | 1/2020 | Widjaja et al. |
| 2020/0035682 A1 | 1/2020 | Han et al. |
| 2020/0051633 A1 | 2/2020 | Widjaja |
| 2020/0075091 A1 | 3/2020 | Louie et al. |
| 2020/0083373 A1 | 3/2020 | Han et al. |
| 2020/0090734 A1 | 3/2020 | Han et al. |
| 2020/0091155 A1 | 3/2020 | Widjaja |
| 2020/0111792 A1 | 4/2020 | Louie et al. |
| 2020/0118627 A1 | 4/2020 | Widjaja |
| 2020/0118628 A1 | 4/2020 | Widjaja |
| 2020/0135863 A1 | 4/2020 | Han et al. |
| 2020/0168267 A1 | 5/2020 | Han et al. |
| 2020/0168609 A1 | 5/2020 | Widjaja et al. |
| 2020/0203346 A1 | 6/2020 | Widjaja |
| 2020/0227415 A1 | 7/2020 | Widjaja et al. |
| 2020/0227478 A1 | 7/2020 | Han et al. |
| 2020/0243529 A1 | 7/2020 | Widjaja et al. |
| 2020/0243530 A1 | 7/2020 | Widjaja |
| 2020/0312855 A1 | 10/2020 | Widjaja |
| 2020/0335156 A1 | 10/2020 | Louie et al. |
| 2020/0335503 A1 | 10/2020 | Widjaja et al. |
| 2020/0342939 A1 | 10/2020 | Widjaja |
| 2020/0411521 A1 | 12/2020 | Widjaja et al. |
| 2021/0005608 A1 | 1/2021 | Widjaja |
| 2021/0050059 A1 | 2/2021 | Widjaja |
| 2021/0057027 A1 | 2/2021 | Louie et al. |
| 2021/0074358 A1 | 3/2021 | Widjaja |
| 2021/0083110 A1 | 3/2021 | Han et al. |
| 2021/0151097 A1 | 5/2021 | Han et al. |
| 2021/0159227 A1 | 5/2021 | Widjaja et al. |
| 2021/0183432 A1 | 6/2021 | Han et al. |
| 2021/0217754 A1 | 7/2021 | Louie et al. |
| 2021/0225844 A1 | 7/2021 | Widjaja et al. |
| 2021/0249078 A1 | 8/2021 | Widjaja |
| 2021/0257025 A1 | 8/2021 | Widjaja |
| 2021/0257365 A1 | 8/2021 | Widjaja |
| 2021/0288051 A1 | 9/2021 | Han et al. |
| 2021/0327880 A1 | 10/2021 | Widjaja |
| 2021/0358547 A1 | 11/2021 | Louie et al. |
| 2021/0375870 A1 | 12/2021 | Widjaja |
| 2021/0398981 A1 | 12/2021 | Widjaja |
| 2022/0059537 A1 | 2/2022 | Widjaja et al. |
| 2022/0085168 A1 | 3/2022 | Han et al. |
| 2022/0093175 A1 | 3/2022 | Widjaja |
| 2022/0115061 A1 | 4/2022 | Louie et al. |
| 2022/0130451 A1 | 4/2022 | Han et al. |
| 2022/0199160 A1 | 6/2022 | Widjaja |
| 2022/0246205 A1 | 8/2022 | Han et al. |
| 2022/0262430 A1 | 8/2022 | Louie et al. |
| 2022/0262800 A1 | 8/2022 | Widjaja |
| 2022/0278104 A1 | 9/2022 | Widjaja et al. |
| 2022/0344337 A1 | 10/2022 | Widjaja et al. |
| 2022/0352168 A1 | 11/2022 | Widjaja |
| 2022/0359522 A1 | 11/2022 | Widjaja et al. |
| 2022/0367472 A1 | 11/2022 | Louie et al. |

(56) References Cited

U.S. PATENT DOCUMENTS

2023/0024277 A1   1/2023   Widjaja
2023/0035384 A1   2/2023   Han et al.
2023/0045758 A1   2/2023   Widjaja

OTHER PUBLICATIONS

Andrade, et al., "The Impact of Back Bias on the Floating Body Effect in UTBOX SOI Devices for 1T-FBRAM Memory Applications", Devices, Circuits and Systems (ICCDCS), 2012 8th International Caribbean Conference on. IEEE, 2012, pp. 1-4.

Aoulaiche, et al. "Junction Field Effect on the Retention Time for One-Transistor Floating-Body RAM." Electron Devices, IEEE Transactions on, vol. 59, No. 8, 2012, pp. 2167-2172.

Aoulaiche, et al. "Hot hole induced damage in 1T-FBRAM on bulk FinFET." Reliability Physics Symposium (IRPS), 2011 IEEE International. IEEE, 2011, pp. 99-104.

Avci, et al. "Floating-Body Diode—A Novel DRAM Device." Electron Device Letters, IEEE, vol. 33, No. 2, 2012, pp. 161-163.

Bawedin, et al., "Floating-Body SOI Memory: Concepts, Physics, and Challenges", ECS Transactions 19.4 (2009), pp. 243-256.

Ban, et al. "Integration of Back-Gate doping for 15-nm node floating body cell (FBC) memory." VLSI Technology (VLSIT), 2010 Symposium on. IEEE, 2010, pp. 159-160.

Cho, et al. "Variation-aware study of BJT-based capacitorless DRAM cell scaling limit." Silicon Nanoelectronics Workshop (SNW), 2012 IEEE. IEEE, 2012, pp. 1-2.

Cho, et al. "Variation Study and Implications for BJT-Based Thin-Body Capacitorless DRAM." Electron Device Letters, IEEE, vol. 33, No. 3, 2012, pp. 312-314.

Chiu, et al. "Characteristics of a new trench-oxide thin-film transistor and its 1T-DRAM applications." Solid-State and Integrated Circuit Technology (ICSICT), 2010 10th IEEE International Conference on. IEEE, 2010, pp. 1106-1108.

Chiu, et al. "A simple process of thin-film transistor using the trench-oxide layer for improving 1T-DRAM performance." Next-Generation Electronics (ISNE), 2010 International Symposium on. IEEE, 2010, pp. 254-257.

Chun, et al. "A 1.1 V, 667MHZ random cycle, asymmetric 2T gain cell embedded DRAM with a 99.9 percentile retention time of 110usec." VLSI Circuits (VLSIC), 2010 IEEE Symposium on. IEEE, 2010, pp. 191-192.

Chun, et al. "A 667 MHZ Logic-Compatible Embedded DRAM Featuring an Asymmetric 2T Gain Cell for High Speed On-Die Caches." Solid-State Circuits, IEEE Journal of, vol. 47, No. 2, 2012, pp. 547-559.

Cao, et al. "A Novel 1T-1D DRAM Cell for Embedded Application." Electron Devices, IEEE Transactions on, vol. 59, No. 5, 2012, pp. 1304-1310.

Collaert, et al. "Substrate bias dependency of sense margin and retention in bulk FinFET 1T-DRAM cells." Solid-State Electronics 65 (2011, pp. 205-210.

Collaert, et al. "A low-voltage biasing scheme for aggressively scaled bulk FinFET 1T-DRAM featuring 10s retention at 85 C." VLSI Technology (VLSIT), 2010 Symposium on. IEEE, 2010, pp. 161-162.

Chatterjee, et al. "Taper isolated dynamic gain RAM cell." Electron Devices Meeting, 1978 International. vol. 24. IEEE, 1978, pp. 698-699.

Chatterjee, et al. Circuit Optimization of the Paper Isolated Dynamic Gain RAM Cell for VLSI Memories, pp. 22-23, 1979.

Chatterjee, et al. "a survey of high-density dynamic RAM cell concepts." Electron Devices, IEEE Transactions on 26.6 (1979): 827-839.

Erb, D. "Stratified charge memory." Solid-State Circuits Conference. Digest of Technical Papers. 1978 IEEE International. vol. 21. IEEE, 1978, pp. 24-25.

Galeti, M., et al. "BJT effect analysis in p- and n-SOI MuGFETs with high-k gate dielectrics and TiN metal gate electrode for a 1T-DRAM application." SOI Conference (SOI), 2011 IEEE International. IEEE, 2011, pp. 1-2.

Gamiz, et al. "3D Trigate 1T-DRAM Memory Cell for 2x nm Nodes." Memory Workshop (IMW), 2012 4th IEEE International. IEEE, 2012, pp. 1-4.

Gamiz, et al. "A 20nm low-power triple-gate multibody 1T-DRAM cell." VLSI Technology, Systems, and Applications (VLSI-TSA), 2012 International Symposium on. IEEE, 2012, pp. 1-2.

Giusi, et al. "Bipolar mode operation and scalability of double-gate capacitorless 1T-DRAM cells." Electron Devices, IEEE Transactions on, vol. 57, No. 8 (2010), pp. 1743-1750.

Gupta, et al. "32nm high-density high-speed T-RAM embedded memory technology." Electron Devices Meeting (IEDM), 2010 IEEE International. IEEE, 2010, pp. 12-1.

Han, et al. "Bistable resistor (biristor)-gateless silicon nanowire memory." VLSI Technology (VLSIT), 2010 Symposium on. IEEE, 2010, pp. 171-172.

Han, et al. "Biristor—Bistable resistor based on a silicon nanowire." Electron Device Letters, IEEE 31.8 (2010): 797-799.

Hubert, et al., "Experimental comparison of programming mechanisms in 1T-DRAM cells with variable channel length", Solid-State Device Research Conference (ESSDERC), 2010 Proceedings of the European, pp. 150-153, Sep. 14-16, 2010.

Hwang, et al. "Offset buried metal gate vertical floating body memory technology with excellent retention time for DRAM application." VLSI Technology (VLSIT), 2011 Symposium on. IEEE, 2011, pp. 172-173.

Kim, et al. "Vertical double gate Z-RAM technology with remarkable low voltage operation for DRAM application." VLSI Technology (VLSIT), 2010 Symposium on, 2010, pp. 163-164.

Kim, et al. "Silicon on replacement insulator (SRI) floating body cell (FBC) memory." VLSI Technology (VLSIT), 2010 Symposium on. IEEE, 2010, pp. 165-166.

Kim, et al. "Optical charge-pumping: A universal trap characterization technique for nanoscale floating body devices." VLSI Technology (VLSIT), 2011 Symposium on. IEEE, 2011, pp. 190-191.

Kim, et al. "Investigation of 1T DRAM cell with non-overlap structure and recessed channel." Silicon Nanoelectronics Workshop (SNW), 2010. IEEE, 2010, pp. 1-2.

Kim, et al. Resistive-Memory Embedded Unified RAM (R-URAM, 2009, pp. 2670-2674.

Lu, et al., "A Floating-Body/Gate DRAM Cell Upgraded for Long Retention Time", IEEE Elec. Dev. Letters, vol. 32, No. 6, pp. 731-733, Jun. 2011.

Lu, et al., "A Simplified Superior Floating-Body/Gate DRAM Cell", IEEE Elec. Dev. Letters, vol. 30, No. 3, Mar. 2009, pp. 282-284.

Lee, et al. "A Novel Capacitorless 1T DRAM Cell for Data Retention Time Improvement." Nanotechnology, IEEE Transactions on, vol. 10, No. 3, 2011, pp. 462-466.

Leiss, et al, "dRAM Design Using the Taper-Isolated Dynamic RAM Cell." Solid-State Circuits, IEEE Journal of 17.2 (1982): 337-344.

Liu, Xuelian, et al. "A three-dimensional DRAM using floating body cell in FDSOI devices." Design and Diagnostics of Electronic Circuits & Systems (DDECS), 2012 IEEE 15th International Symposium on. IEEE, 2012, pp. 159-162.

Mahatme, et al. "Total ionizing dose effects on ultra thin buried oxide floating body memories." Reliability Physics Symposium (IRPS), 2012 IEEE International, 2012, pp. 1-5.

Moon, et al. "An optically assisted program method for capacitorless 1T-DRAM." Electron Devices, IEEE Transactions on, vol. 57, No. 7, 2010, pp. 1714-1718.

Moon, et al. "Multi-functional universal device using a band-engineered vertical structure." Electron Devices Meeting (IEDM), 2011 IEEE International. IEEE, 2011, pp. 24-26.

Moon, et al. "Fin-width dependence of BJT-based 1T-DRAM implemented on FinFET." Electron Device Letters, vol. 31, No. 9 (2010): 909-911.

Moon, et al. "Ultimately scaled 20nm unified-RAM." Electron Devices Meeting (IEDM), 2010 IEEE International. IEEE, 2010, pp. 12-12.

(56) References Cited

OTHER PUBLICATIONS

Nicoletti, et al. "The Dependence of Retention Time on Gate Length in UTBOX FBRAM With Different Source/Drain Junction Engineering." Electron Device Letters, vol. 33, No. 7, 2012, pp. 940-942.
Pulicani, R., et al. "Simulation of intrinsic bipolar transistor mechanisms for future capacitor-less eDRAM on bulk substrate." Electronics, Circuits, and Systems (ICECS), 2010 17th IEEE International Conference on. IEEE, 2010, pp. 966-969.
Pellizzer et al., A 90nm Phase Change Memory Technology for Stand-Alone Non-Volatile Memory Applications, pp. 1-1, 2006.
Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.
Ranica et al. Scaled 1T-Bulk devices built with CMOS 90nm technology for low-cost eDRAM applications. Pascale. mazoyer@st.com, 2005, 38-39.
Reisch, "On bistable behavior and open-base breakdown of bipolar transistors in the avalanche regime-modeling and applications." Electron Devices, IEEE Transactions on 39.6 (1992): 1398-1409.
Ban et al., A Scaled Floating Body Cell (FBC) Memory with High-k+Metal Gate on Thin-Silicon and Thin-BOX for 16-nm Technology Node and Beyond, Symposium on VLSI Technology, 2008, pp. 92-93.
Campardo G. et al., VLSI Design of Non-Volatile Memories, 2005.
Han et al. Programming/Erasing Characteristics of 45 nm NOR-Type Flash Memory Based on SOI FinFET Structure. vol 47, Nov. 2005, pp. S564-S567.
Headland. Hot electron injection, Feb. 19, 2004.
Lanyon, et al., "Bandgap Narrowing in Moderately to Heavily Doped Silicon", pp. 1 1014-1018, No. 7, vol. ED-26, 1979.
Lin, et al., A new 1T Dram Cell with enhanced Floating Body Effect, pp. 1-5, 2006.
Oh, et al., a 4-Bit Double SONOS memory (DSM) with 4 Storage Nodes Per Cell for Ultimate Multi-Bit Operation, pp. 1-2, 2006.
Ohsawa et al., An 18.5ns 128Mb SOI DRAM with a Floating body Cell, IEEE International Solid-State Circuits Conference, 2005, pp. 458-459, 609.
Ohsawa, et al. Autonomous refresh of floating body cell (FBC), 2008, pp. 801-804.
Ohsawa, et al. Autonomous refresh of floating-body cell due to current Anomaly of Impact Ionization, 2009, pp. 2302-2311.
Ohsawa et al., Memory Design Using One-Transistor Gain Cell on SOI, Tech. Digest, IEEE International Solid-State Circuits, vol. 37, No. 11, 2002, pp. 1510-1522.
Ohsawa, et al., "A Novel Capacitor-less DRAM Cell: Floating Body Cell", CRC Press, Taylor & Francis Group, 2012, pp. 1-7.
Okhonin, et al. A Capicitor-Less IT-DRAM Cell, vol. 23, No. 2, Feb. 2002, pp. 85-87.
Okhonin et al. A SOI Capacitor-less 1T-DRAM Concept. 2001, pp. 153-154.
Okhonin, et al., Principles of Transient Charge Pumping on Partially Depleted SOI MOSFETs, IEEE Electron Device Letters, vol. 23, No. 5, May 2002, pp. 279-281.
Rodriguez, et al. "A-RAM: Novel capacitor-less DRAM memory." In SOI Conference, 2009 IEEE International, pp. 1-2. IEEE, 2009.
Rodriguez, et al. "Novel capacitorless 1T-DRAM cell for 22-nm node compatible with bulk and SOI substrates." Electron Devices, IEEE Transactions on, vol. 58, No. 8 (2011), pp. 2371-2377.
Rodriguez, et al. "A-RAM memory cell: concept and operation." Electron Device Letters, IEEE, vol. 31, No. 9 (2010), pp. 972-974.
Robert F. Pierret. Semiconductor Device Fundamentals, ISBN: 0-201-54393-1, 1996, by Addison-Wesley Publishing Company, Inc. PNPN Devices 463-476.
Romanjek, et al., "Compact (Wg/Lg=80/85nm) FDSOI 1T-DRAM programmed by Meta Stable Dip", Ultimate Integration on Silicon (ULIS), 2012 13th International Conference on, Mar. 6, 2012, pp. 199-202.
Rothemund, et al., The importance of being modular, vol. 485, May 2012 pp. 584-585.
Sakui, Koji, et al. "A new static memory cell based on reverse base current (RBC) effect of bipolar transistor." Electron Devices Meeting, 1988. IEDM'88. Technical Digest., International. IEEE, 1988, pp. 44-47.
Sakui, K., et al. "A new static memory cell based on the reverse base current effect of bipolar transistors." Electron Devices, IEEE Transactions on 36.6 (1989): 1215-1217.
Shim, Kyung-Suk, In-Young Chung, and Young June Park. "A BJT-Based Heterostructure 1T-DRAM for Low-Voltage Operation." Electron Device Letters, vol. 33, No. 1, 2012, pp. 14-16.
Shin, et al. "Vertical-Gate Si/SiGe Double-HBT-Based Capacitorless 1T DRAM Cell for Extended Retention Time at Low Latch Voltage." Electron Device Letters, vol. 33, No. 2, 2012, pp. 134-136.
Shin, et al. "A novel double HBT-based capacitorless 1T DRAM cell with Si/SiGe heterojunctions." Electron Device Letters, vol. 32, No. 7, 2011, pp. 850-852.
Sze, et al. Physics of Semiconductor Devices, 2007, pp. 1-4.
Tack, et al. "The multistable charge-controlled memory effect in SOI MOS transistors at low temperatures." Electron Devices, IEEE Transactions on 37.5 (1990): 1373-1382.
Terada, et al. "A new VLSI memory cell using capacitance coupling (CC cell)." Electron Devices, IEEE Transactions on 31.9 (1984): pp. 319-1324.
Ventrice, et al. "Analytical model of deeply-scaled thyristors for memory applications." Microelectronics and Electron Devices (WMED), 2012 IEEE Workshop on. IEEE, 2012, pp. 1-4.
Villaret, et al. "Further insight into the physics and modeling of floating-body capacitorless DRAMs." Electron Devices, IEEE Transactions on 52.11 (2005): pp. 2447-2454.
Waser, Rainer, Resistive non-volatile memory devices (Invited Paper), 2009, pp. 1925-1928.
Wu, et al. "Experimental Demonstration of the High-Performance Floating-Body/Gate DRAM Cell for Embedded Memories", IEEE Elec. Dev. Letter, vol. 33, No. 6, Jun. 2012, pp. 743-745.
Yoshida et al., A Design of a Capacitorless 1T-DRAM Cell Using Gate-Induced Drain Leakage (GIDL) Current for Low-bower and High-speed Embedded Memory , International Electron Devices Meeting, 2003, pp. 1-4.
Zhang, et al. "Total Ionizing Dose Effects on FinFET-Based Capacitor-Less 1T-DRAMs." Nuclear Science, IEEE Transactions on, vol. 57, No. 6, 2010, pp. 3298-3304.
Villaret et al., "Mechanisms of charge modulation in the floating body of triple-well nMOSFET capacitor-less DRAMs", Microelectronic Engineering 72 (2004) 434-439.
Celler et al., Frontiers of silicon-on-insulator, Journal of Applied Physics, Vo. 93, No. 9, May 1, 2003, pp. 4955-4978.
Cho et al., "A novel capacitor-less DRAM cell using Thin Capacitively-Coupled Thyristor (TCCT)", 2005 IEEE, pp. 1-4.
Langholz et al., "Foundations of Digital Logic Design", World Scientific Publishing Co., 1998, pp. 339-343 and 344.
Montanaro et al., A 160-MHZ, 32-b, 0.5-W CMOS RISC Microprocessor, J. Solid State Circuits, vol. 31, No. 11, Nov. 1996, pp. 1703-1714.
Morishita et al., "A Capacitorless Twin-Transistor Random Access Memory (TTRAM) on SOI", IEICE Trans. Electron., vol. E90-C, No. 4, Apr. 2007, pp. 765-771.
Sugizaki et al., "Ultra High-speed Novel Bulk Thyristor-SRAM (BT-RAM) Cell with Selective Epitaxy Anode (SEA)", 2006, IEEE, pp. 1-4.

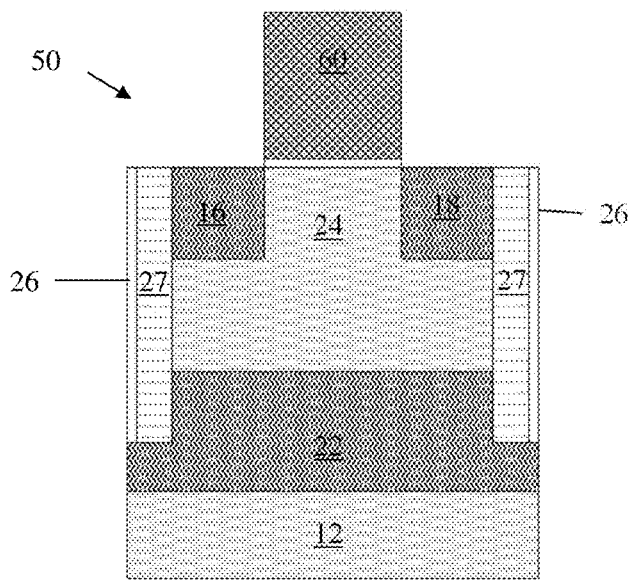
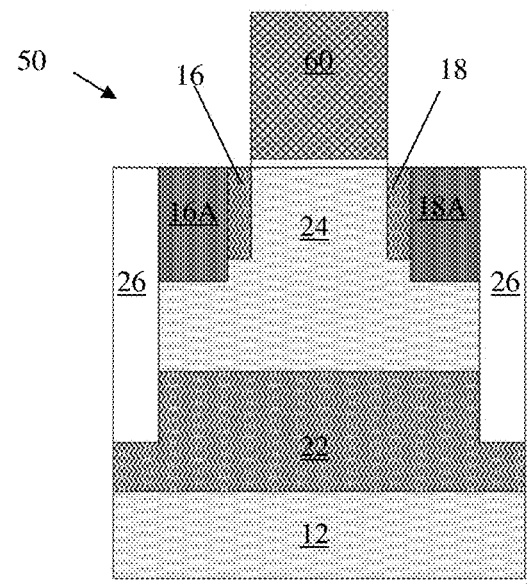
FIG. 7A
FIG. 7B
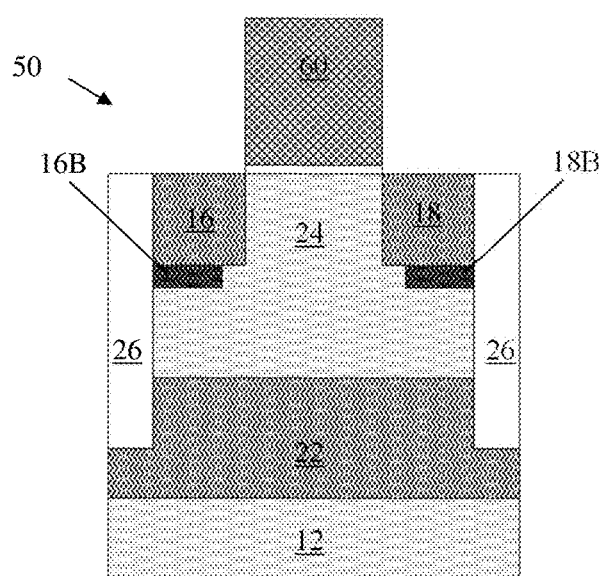
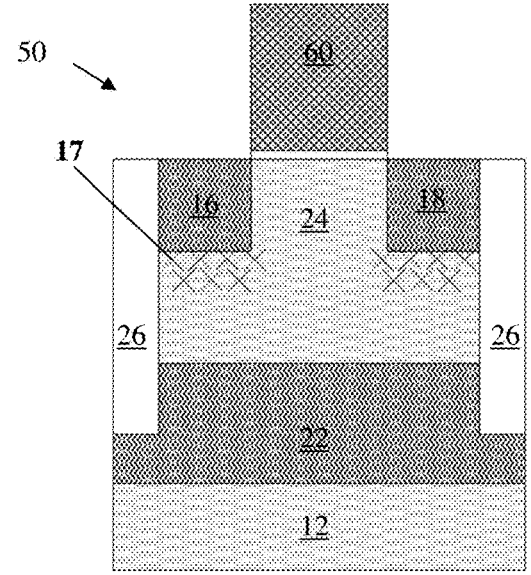
FIG. 7C
FIG. 7D

|  |  | WL | BL | Feature |
|---|---|---|---|---|
| Program | Selected | 3 V | 0 V | Oxide breakdown |
|  | Unselected | Floating or 0 V | Floating or 3 V | No oxide breakdown |
| Read | Selected | 1 V | 0 V | Forward biased |
|  | Unselected | Floating or 0 V | Floating or 1 V | Reverse biased |

FIG. 29

MEMORY CELL AND MEMORY ARRAY SELECT TRANSISTOR

CROSS-REFERENCE

This application is a continuation of co-pending U.S. application Ser. No. 16/740,652, filed Jan. 13, 2020, which claims the benefit of U.S. Provisional Application No. 62/791,537, filed Jan. 11, 2019, U.S. Provisional Application No. 62/817,484, filed Mar. 12, 2019 and U.S. Provisional Application No. 62/933,880, filed Nov. 11, 2019; which applications are each hereby incorporated herein, in their entireties, by reference thereto and to which applications we claim priority under 35 U.S.C. Sections 120 and 119, respectively.

FIELD OF THE INVENTION

This invention relates to the field of semiconductor metal-oxide-semiconductor field effect transistors (MOSFETs). More particularly, the invention relates to MOSFETs as memory select transistors. The invention also relates to one-time programmable (OTP) antifuse memory, memory arrays, and semiconductor devices comprising an electrically floating body transistor.

BACKGROUND OF THE INVENTION

Because PN junctions are created in source-to-channel and the drain-to-channel of a MOSFET, a BJT is inherently formed during manufacture of the MOSFET. The inherent BJT is connected in parallel to the MOSFET, where emitter, base, and collector of the BJT are formed from the source, channel, and drain of the MOSFET, respectively.

In a conventional MOSFET, the intrinsic BJT rarely contributes to the drain current. Currently, the manufacturing process and operation scheme for MOSFETs are designed to nullify the effect of the inherent BJT. Clearly, a manufacturing process and operation scheme that would utilize the inherent BJT to enhance the MOSFET performance would be desirable.

When a MOSFET is used as a select transistor of a memory element for embedded application or stand-alone application, it would be desirable to maximize the on-state current drivability for write and read operations while minimizing the channel width or physical area of the select transistor.

One-time programmable (OTP) memory is becoming popular and common for various applications. Particularly, OTP embedded in SoC (system on a chip) become more prevalent in consumer electronics, industry, automobile, security, internet-of-things applications.

As the embedded OTP memory is incorporated onto the same underlying SoC semiconductor, it would be desirable if the process modification and added layer from the baseline process are minimized.

OTP based on gate dielectric antifuse are broadly used, wherein the gate dielectric capacitor is used as storage element. The conductive channel across the gate dielectric capacitor is formed by dielectric breakdown forced by high voltage pulse. One category of the OTP uses a storage capacitor coupled in series with a select transistor. This category of OTP has a disadvantage in its area density. Another category of the OTP is cross-point memory consisting of a single gate dielectric capacitor. The cross-point memory is attractive due to its compact area. However, previous cross-point OTP involves process complexity or high leakage current due to uncontrollable selection diode.

SUMMARY OF THE INVENTION

A semiconductor device structure to increase on-state drain current but also the off-state drain current is minimized. Methods of operating the semiconductor device as a memory select transistor and volatile/non-volatile memory cell are provided.

Memory select transistors with increased on-state current obtained through bipolar junction transistor (BJT) of MOSFET are described for semiconductor non-volatile memory cell having reduced operating voltage by utilizing inherent bipolar junction transistor (BJT). More particularly, the on-state drain current is increased due to the turned-on BJT when the MOSFET is turned on but the off-state drain current is unchanged due to the turned-off BJT when the MOSFET is turned off.

One-time-programmable (OTP) antifuse memory and memory array are also described. In at least one embodiment, the OTP antifuse memory and memory array are implemented on bulk FinFET technology.

A semiconductor memory device comprising an electrically floating body transistor is also described.

In one aspect of the present invention, a semiconductor device configured to function as a memory select transistor with increased on-state drain current, includes a substrate having a first conductivity type selected from p-type conductivity type and n-type conductivity type; a buried layer having a second conductivity type selected from the p-type conductivity type and the n-type conductivity type and being different from the first conductivity type; a body having the first conductivity type; a source region and a drain region each having the second conductivity type and being separated by the body; and a gate positioned in between the source region and the drain region; wherein the semiconductor device is configured to function as a select transistor connected to at least one memory element having at least two stable states, wherein the state of the memory element is determined by its resistivity, depending on biases that are applied to the semiconductor device.

In at least one embodiment, the amount of on-state drain current enhancement of semiconductor device functioning as the memory select transistor connected to at least one memory element having at least two stable states is governed by an amount of voltage applied to the buried layer.

In at least one embodiment, a relatively low voltage applied to the buried layer governs the semiconductor device to function as a conventional MOSFET (metal-oxide-semiconductor field effect transistor) and wherein a relatively high voltage applied to the buried layer governs the semiconductor device to a single transistor latch state having at least two stable states at gate voltage of 0 V.

In at least one embodiment, a relatively intermediate high voltage applied to the buried layer higher than the relatively low voltage and lower than the relatively high voltage, but sufficient to turn on a vertical bipolar junction transistor (BJT) formed by the buried layer, the body and the source region, turns on a lateral BJT formed by the source region, the body and the drain region, resulting in increased on-state drain current at high gate voltage.

In at least one embodiment, the on-state drain current comprises the sum of current from a MOS transistor formed by the source region, the gate and the drain region and current from the lateral BJT.

In at least one embodiment, the semiconductor device further includes a buried layer tap connected to the buried layer.

In at least one embodiment, the semiconductor device is FinFET which body comprises a fin structure extending perpendicularly from the substrate.

In at least one embodiment, the charge trap layer directly contacts at least one of the source region and the drain region.

In at least one embodiment, the charge trap layer indirectly contacts at least one of the source region and the drain region via a thin interfacial oxide layer.

In at least one embodiment, the semiconductor device further includes a metal silicide junction located at least one of: between the source region and the body, and between the drain region and the body.

In at least one embodiment, the semiconductor device further includes an energy band offset region located at least one of: between the source region and the body, and between the drain region and the body.

In at least one embodiment, the energy band offset region comprises a valence band offset material.

In at least one embodiment, the semiconductor device further includes a recombination center located at least one of: between the source region and the body, and between the drain region and the body.

In at least one embodiment, the recombination center is formed by doping with deep level impurities.

In at least one embodiment, the deep level impurities comprise at least one of gold or platinum.

In at least one embodiment, the recombination center is formed by introducing crystallinity damage through ion implantation.

In at least one embodiment, ions used for the ion implantation are selected from at least one of the group consisting of: Si ions, Ge ions and Ar ions.

In at least one embodiment, the memory element connected to the memory select transistor is one of resistive switching memory (RRAM), phase change memory (also known as PCM, PRAM, PCRAM), Chalcogenide memory (CRAM), magnetoresistive memory (MRAM).

In at least one embodiment, at least two memory select transistors are connected to one memory element for multi-port operation.

In at least one embodiment, at least two memory elements are connected to one memory select transistors for 1T-nM architecture.

In at least one embodiment, the memory elements are three-dimensionally stacked.

In at least one embodiment of the present invention, a boosted MOSFET offers at least 50% greater drive current compared to a conventional MOSFET.

In one aspect of the present invention, a semiconductor memory device includes a semiconductor device as a memory select transistor and a memory element, wherein the memory select transistor includes a floating body region.

These and other advantages and features of the invention will become apparent to those persons skilled in the art upon reading the details of the devices and methods as more fully described below.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIG. 7A is a schematic, cross-sectional illustration of a MOS device with charge trap layer lined in the trench isolation region according to an embodiment of the present invention.

FIG. 7B is a schematic, cross-sectional illustration of a MOS device with metal silicided junction partially contacting the body region according to an embodiment of the present invention.

FIG. 7C is a schematic, cross-sectional illustration of a MOS device with junction with energy band offset compared to body region according to an embodiment of the present invention.

FIG. 7D is a schematic, cross-sectional illustration of a MOS device with recombination centers disposed near the junction according to an embodiment of the present invention.

FIG. 29 illustrates exemplary bias conditions for the operation of the memory array of FIG. 25.

DETAILED DESCRIPTION OF THE INVENTION

Before the present MOSFETS, transistors, memory select transistors, memory elements, memory cells and arrays are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a cell" includes a plurality of such cells and reference to "the region" includes reference to one or more regions and equivalents thereof known to those skilled in the art, and so forth.

The publications discussed herein are provided solely for their disclosure prior to the filing date of the present application. The dates of publication provided may be different from the actual publication dates which may need to be independently confirmed.

Figure 1:
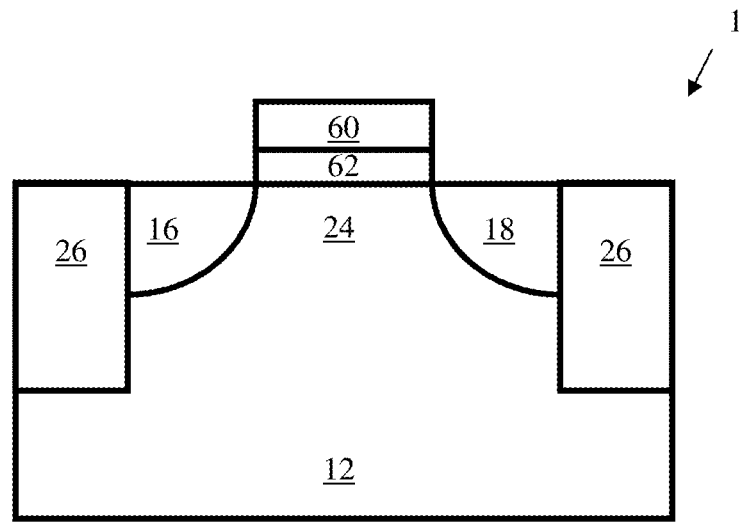
FIG. 1 is a schematic, cross-sectional illustration of a conventional MOS device.

FIG. 1 illustrates a prior art metal-oxide semiconductor field effect transistor (MOSFET) 1 in which both n-channel and p-channel MOSFETs are fabricated on the same chip having a substrate 12. A BJT is inherently formed during manufacture of the MOSFET. The intrinsic BJT is connected in parallel to the MOSFET, where emitter, base, and collector of the intrinsic BJT are formed from the source 16, channel 24, and drain 18 of the MOSFET 1, respectively. The MOSFET 1 further includes a gate 60, gate insulator 62 and insulators 26. The intrinsic BJT of MOSFET 1 rarely contributes to the drain current. Currently, the manufacturing process and operation scheme for conventional MOSFETs are designed to nullify the effect of the inherent BJT.

Figure 2A:
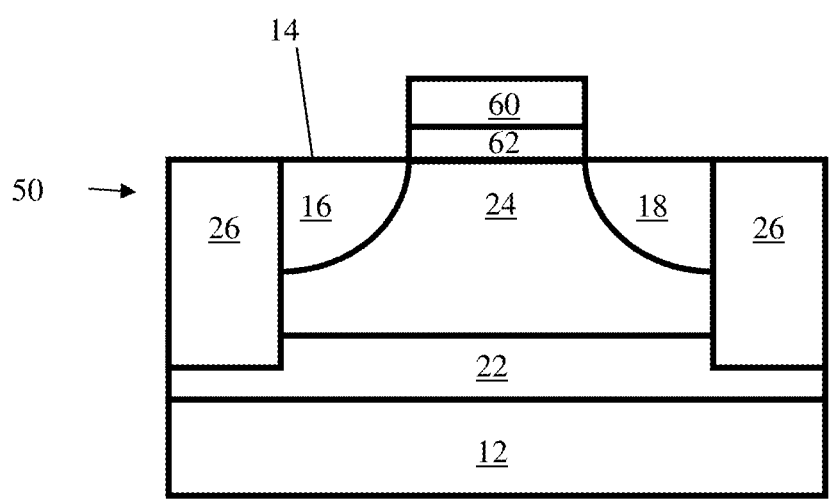
FIG. 2A is a schematic, cross-sectional illustration of a MOS device according to the present invention.

Referring to FIG. 2A, a semiconductor device 50 according to an embodiment of the present invention is shown. Semiconductor device 50 may function as a memory select transistor with increased on-state drain current, but with no change in the off-state drain current, depending on the bias applied to the semiconductor device 50.

Semiconductor device 50 includes a substrate 12 of a first conductivity type such as p-type, for example. Substrate 12 is typically made of silicon, but may also comprise, for example, germanium, silicon germanium, gallium arsenide, and/or other semiconductor materials. In some embodiments of the invention, substrate 12 can be the bulk material of the semiconductor wafer. In another embodiment shown in FIG. 3, substrate 12A of a first conductivity type (for example, p-type) can be a well of the first conductivity type embedded in a well 29 of the second conductivity type, such as n-type. The well 29 in turn can be another well inside substrate 12B of the first conductivity type (for example, p-type). In another embodiment, well 12A can be embedded inside the bulk of the semiconductor wafer of the second conductivity type (for example, n-type). These arrangements allow for segmentation of the substrate terminal (not shown in FIG. 3), which is connected to 12A. To simplify the description, the substrate 12 will usually be drawn as the semiconductor bulk material as it is in FIG. 2A.

Semiconductor device 50 also includes a buried layer 22 of a second conductivity type, such as n-type, for example; a body 24 of the first conductivity type, such as p-type, for example; and source/drain regions 16 and 18 of the second conductivity type, such as n-type, for example. Buried layer 22 may be formed by an ion implantation process on the material of substrate 12. Alternatively, buried layer 22 can be grown epitaxially on top of substrate 12 or formed through a solid-state diffusion process.

The body 24 of the first conductivity type is bounded on top by source 16, drain 18, and insulating layer 62 (or by surface 14 in general), on the sides by insulating layers 26, and on the bottom by buried layer 22. Body 24 may be the portion of the original substrate 12 above buried layer 22 if buried layer 22 is implanted. Alternatively, body 24 may be epitaxially grown on top of the buried layer 22 through a solid-state diffusion process.

A source 16 and drain 18 having a second conductivity type, such as n-type, for example, are provided in body 24, so as to bound a portion of the top of the body 24 in a manner discussed above, and are exposed at surface 14. Source 16 and drain 18 may be formed by an implantation process on the material making up substrate 12, according to any implantation process known and typically used in the art. Alternatively, a solid-state diffusion or a selective epitaxial growth process could be used to form source 16 and drain 18.

A gate 60 is positioned in between the source 16 and the drain 18, above body 24. The gate 60 is insulated from the body 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Figure 2B:
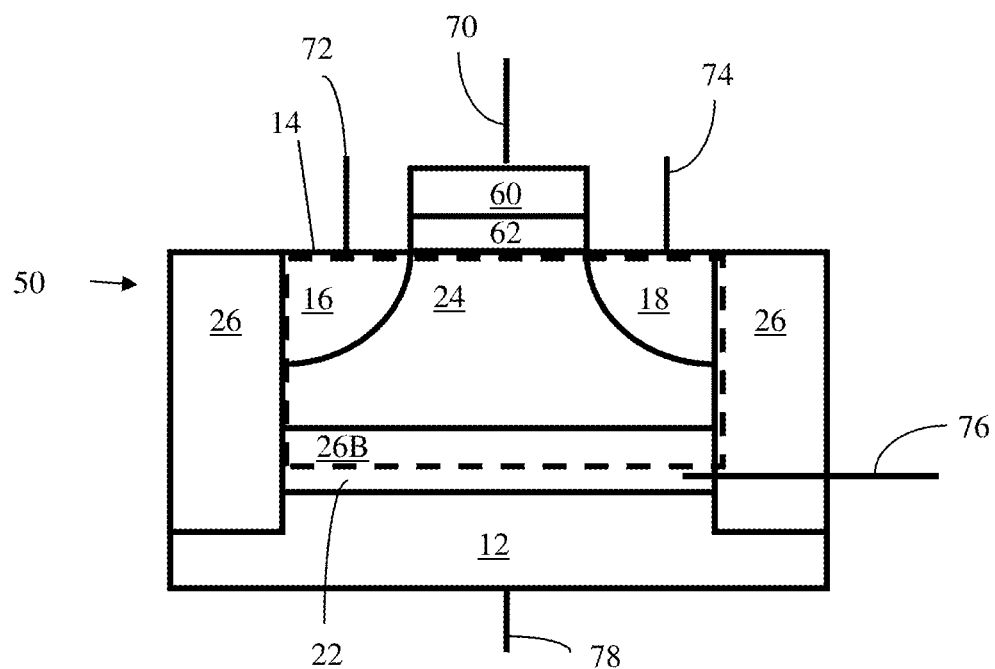
FIG. 2B is a schematic, cross-sectional illustration of a MOS device according to another embodiment of the present invention.
Figure 3:
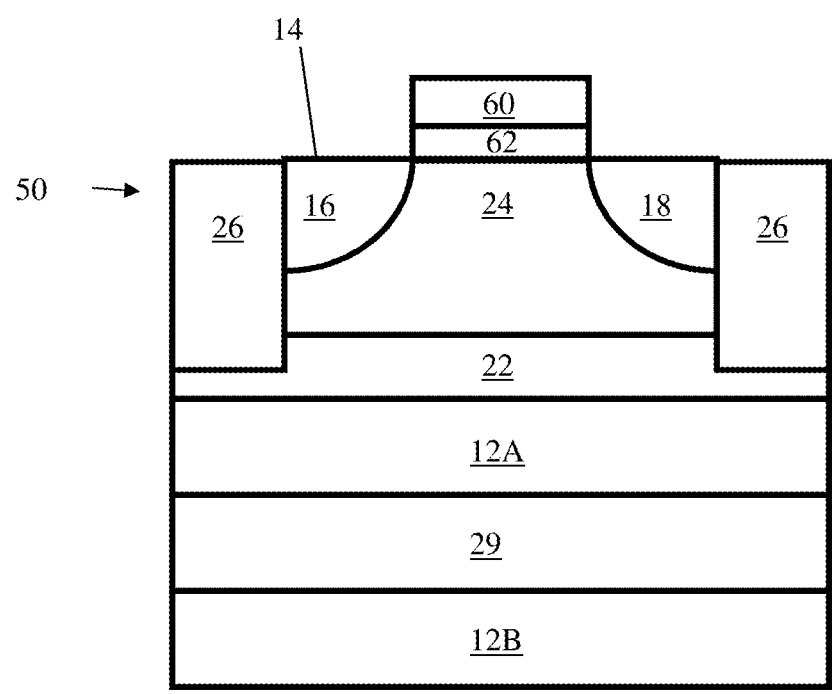
FIG. 3 is a schematic, cross-sectional illustration of a MOS device according to another embodiment of the present invention.

Insulating layers 26 (like, for example, shallow trench isolation (STI)), may be made of silicon oxide, for example, though other insulating materials may be used. Insulating layers 26 insulate semiconductor device 50 from adjacent semiconductor devices 50. The bottom of insulating layer 26 may reside inside the buried layer 22 allowing buried layer 22 to be continuous as shown in FIGS. 2A and 3. Alternatively, the bottom of insulating layer 26 may reside below the buried layer 22 (see FIG. 2B). This requires a shallower insulating layer 26B (where the bottom of insulating layer 26B resides inside the buried layer 22), which insulates the body 24, but allows the buried layer 22 to be continuous in the perpendicular direction of the cross-sectional view shown in FIG. 2A and FIG. 3. For simplicity, only semiconductor device 50 with continuous buried layer 22 in all directions will be shown from hereon.

Figure 4:
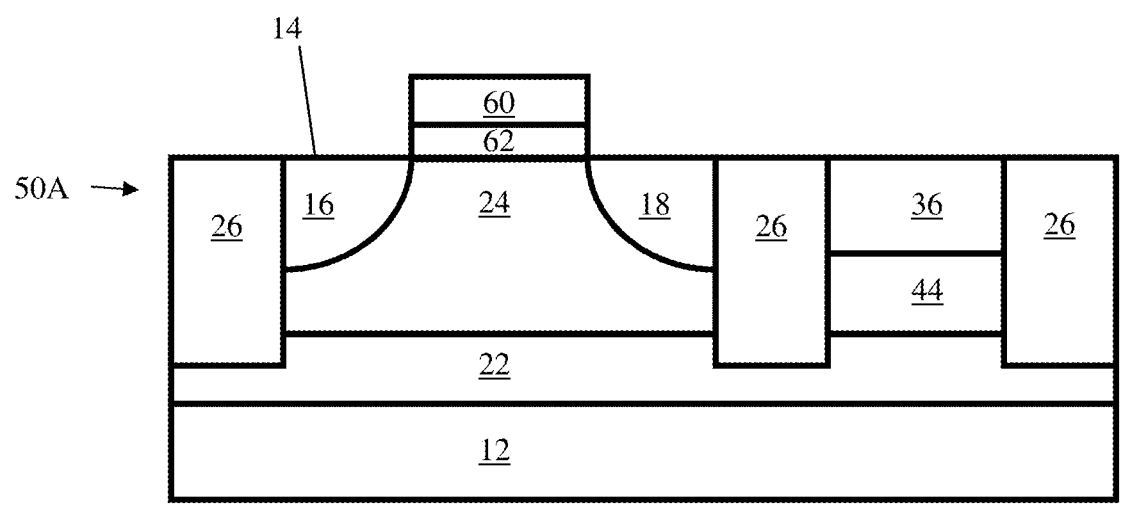
FIG. 4 is a schematic, cross-sectional illustration of a MOS device with buried layer tap region according to an embodiment of the present invention.

FIG. 4 illustrates a cross-sectional illustration of a semiconductor device 50A that includes semiconductor 50 shown in FIG. 2A with buried layer 22 connected to buried layer tap 36 according to an embodiment of the present invention. The buried layer tap 36 having a second conductivity type, such as n-type, for example, is connected to the buried layer 22 through the buried tap body 44 having a second conductivity type, such as n-type. The buried tap body 44 may be formed by an implantation process following the same process step of the well formation of complementary type of MOS transistor such as p-channel device. The buried tap 36 may be formed by an implantation process or selective epitaxial growth process following the same process step of the source and drain formation of complementary type of MOS transistor such as p-channel device. For example, if buried tap body 44 and buried tap 36 are formed by an ion implantation process, the implant energy (which determines the depth of the implant) for buried tap body 44 is higher than the implant energy for buried layer tap 36.

Figure 5A:
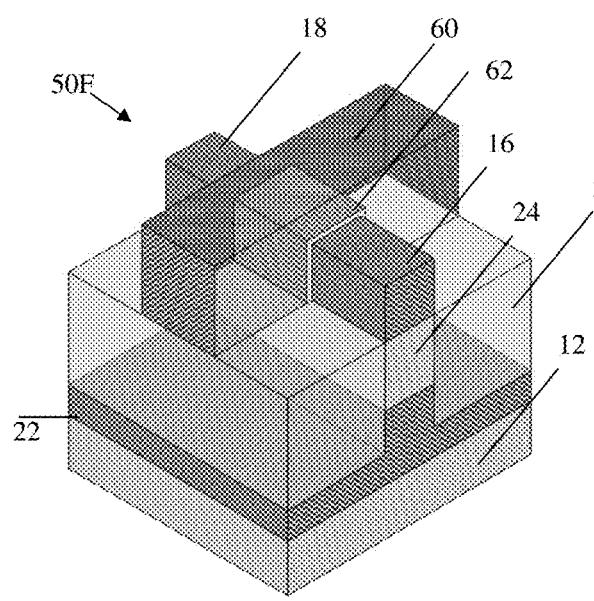
FIG. 5A is a schematic, three-dimensional view of a fin-type MOS device or FinFET according to an embodiment of the present invention.

FIG. 5A illustrates a schematic three-dimensional view of semiconductor device 50F. Fin type semiconductor device 50F includes substrate 12 of a first conductivity type, such as p-type for example, and a buried layer 22 of a second conductivity type, such as n-type, for example; a fin type body 24 of the first conductivity type, such as p-type, for example; and source/drain regions 16 and 18 of the second conductivity type, such as n-type, for example. Buried layer 22 may be formed by an ion implantation process on the material of substrate 12. Alternatively, buried layer 22 can be grown epitaxially on top of substrate 12 or formed through a solid-state diffusion process.

Figure 5B:
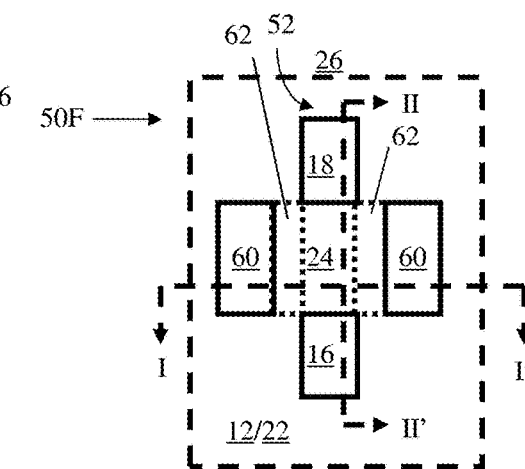
FIG. 5B is a schematic, top view of the MOS device of FIG. 5A.
Figure 5C:
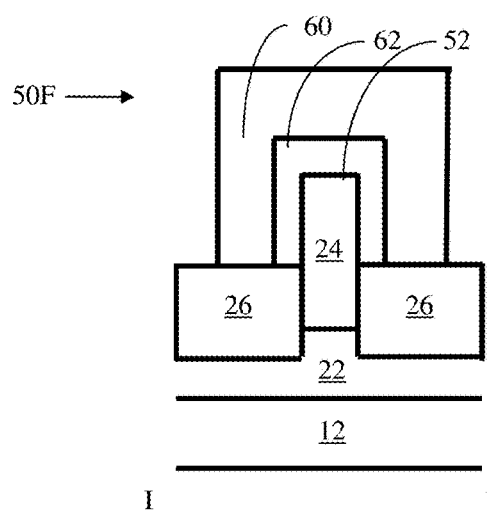
FIG. 5C is a schematic, cross-sectional view of the MOS device of FIG. 5B taken along line I-I'.
Figure 5D:
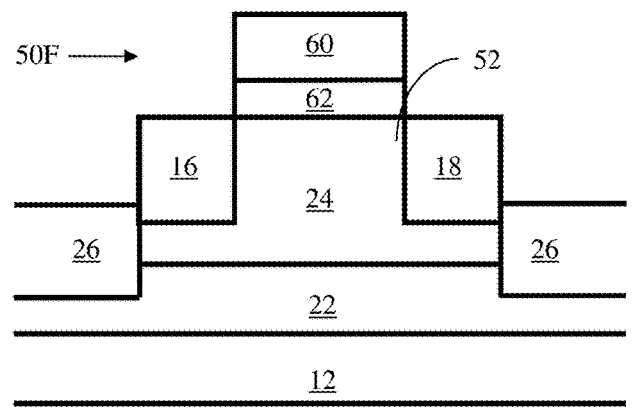
FIG. 5D is a schematic, cross-sectional view of the MOS device of FIG. 5B taken along line II-II'.

FIGS. 5B-5D illustrate a top view and cross-sectional views of semiconductor device 50F comprising a fin structure 52 as shown in FIG. 5A. Fin structure 52 extends perpendicularly from the substrate 12 to form a three-dimensional structure and comprises body 24 having a first conductivity type with buried layer region 22 having a second conductivity type and located below the body 24.

Substrate 12 is typically made of silicon, but may also comprise, for example, germanium, silicon germanium, gallium arsenide, and/or other semiconductor materials. In some embodiments of the invention, substrate 12 can be the bulk material of the semiconductor wafer.

The fin type body 24 of the first conductivity type is bounded on top by source 16, drain 18, and insulating layer 62, on the sides by insulating layer 26, and on the bottom by buried layer 22. Fin type body 24 may be the portion of the original substrate 12 above buried layer 22 if buried layer 22 is implanted. Alternatively, fin type body 24 may be epitaxially grown on top of the buried layer 22 through a solid-state diffusion process.

A source 16 and drain 18 having a second conductivity type, such as n-type, for example, are provided in body 24, so as to bound a portion of the top of the fin type body 24 in a manner discussed above. Source 16 and drain 18 may be formed by an implantation process on the material making up substrate 12, according to any implantation process known and typically used in the art. Alternatively, a solid-state diffusion or a selective epitaxial growth process could be used to form source 16 and drain 18.

A gate 60 is positioned in between the source 16 and the drain 18, above body 24. The gate 60 is insulated from the fin type body 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Insulating layers 26 (like, for example, shallow trench isolation (STI)), may be made of silicon oxide, for example, though other insulating materials may be used. Insulating layers 26 insulate semiconductor device 50F from adjacent fin type MOS devices 50F. The bottom of insulating layer 26 may reside inside the buried layer 22 allowing buried layer 22 to be continuous as shown in FIGS. 5A-5D. Alternatively, the bottom of insulating layer 26 may reside below the buried layer 22 (see FIG. 2B for illustration of insulating layers 26 and 26B having different depths). This requires a shallower insulating layer 26B, which insulates the body 24, but allows the buried layer 22 to be continuous in direction of the I-I' cross-sectional view shown in FIG. 5C. For simplicity, only semiconductor device 50F with continuous buried layer 22 in all directions will be shown from hereon.

Figure 6A:
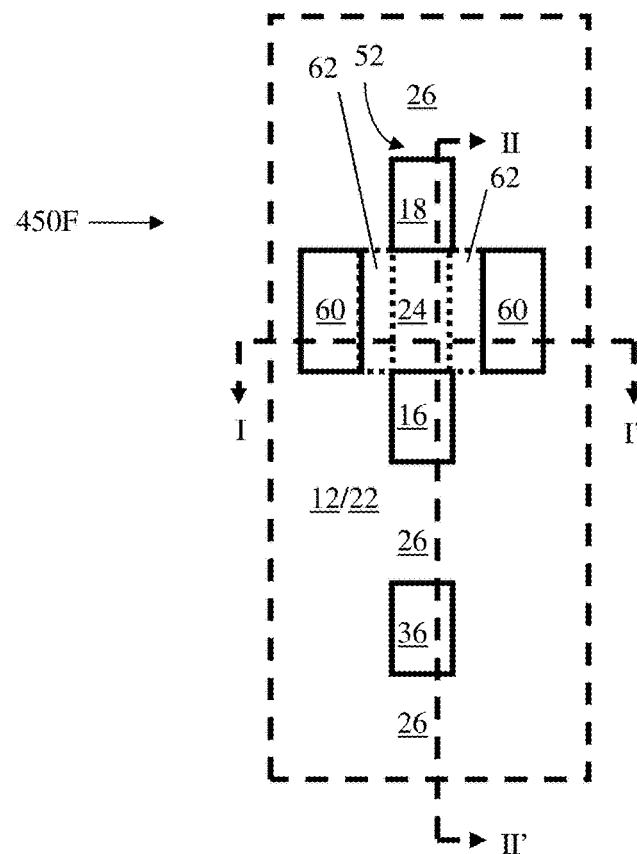
FIG. 6A is a schematic, top view of a MOS device comprising a fin structure having a body tap according to an embodiment of the present invention.
Figure 6B:
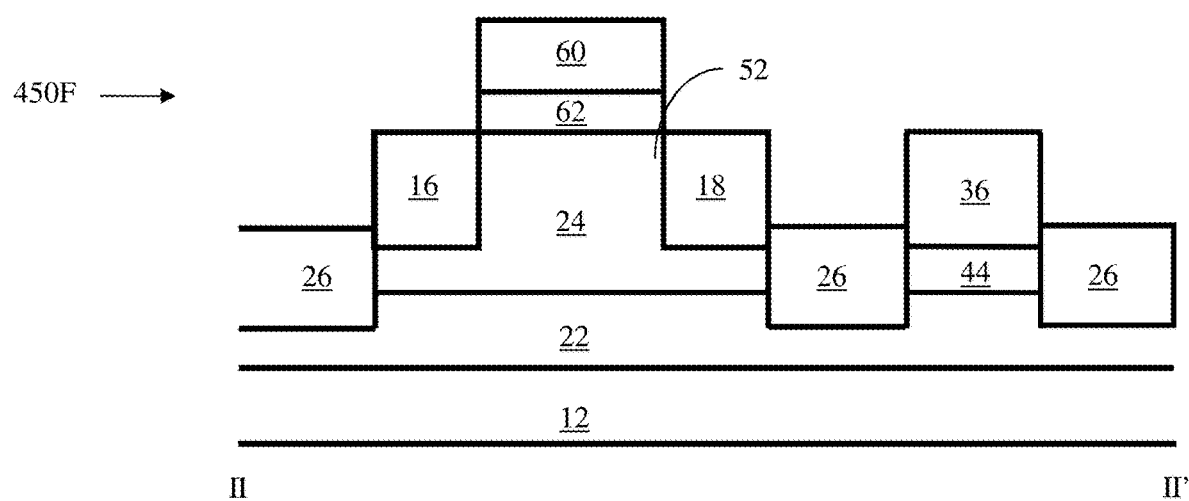
FIG. 6B is a schematic, cross-sectional view of the illustration of the MOS device of FIG. 6A taken along line II-II'.

FIGS. 6A and 6B illustrate top view and cross-sectional view of a fin type semiconductor device 450F that includes fin type semiconductor device 50F shown in FIGS. 5A-5D, but with buried layer 22 connected to buried layer tap 36 according to an embodiment of the present invention. The buried layer tap 36 having a second conductivity type, such as n-type, for example, is connected to the buried layer 22 through the buried tap body 44 having a second conductivity type, such as n-type. The buried tap body 44 may be formed by an implantation process following the same process step of the well formation of complementary fin type of MOS transistor such as p-channel device. The buried tap 36 may be formed by an implantation process or selective epitaxial growth process following the same process step of the source and drain formation of complementary type of MOS transistor such as p-channel device.

Figure 6C:
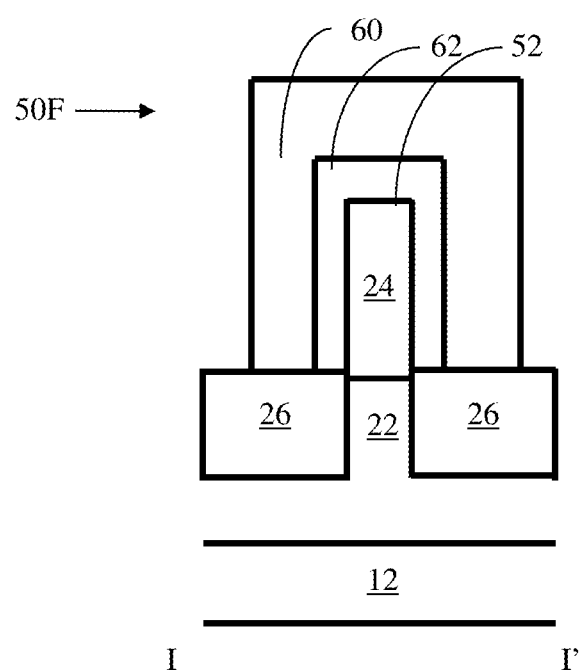
FIG. 6C is a schematic, cross-sectional view of the MOS device according to another embodiment of the present invention.

In one embodiment, the bottom of the gate 60 is extended down to align to the junction between the body 24 and the buried layer 22 (see FIG. 6C). This increases the capacitive coupling efficiency between the gate 60 voltage and the body 24 potential.

Figure 6D:
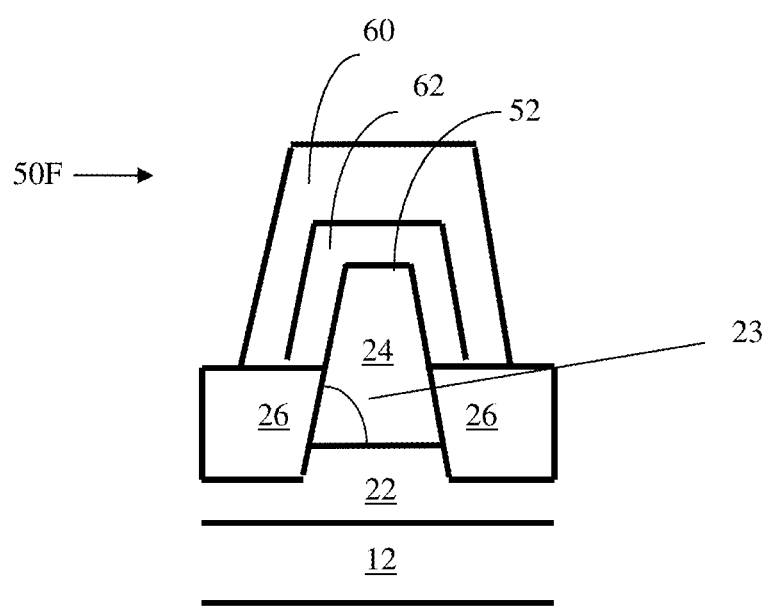
FIG. 6D is a schematic, cross-sectional view of a fin type semiconductor device according to another embodiment of the present invention, in which the fin type body 24 is tapered.

FIG. 6D illustrates a cross-sectional view of a fin type semiconductor device 50F according to another embodiment of the present invention. In order to increase the capacitive coupling efficiency between the gate 60 voltage and the fin type body 24 potential, the fin type body 24 is tapered. The gate 60 voltage controllability to the junction potential between the fin type body 24 and the buried layer 22 may be increased due to the wider fin width near the junction and the angle between the gate 60 and the junction angle 23 between the fin type body 24 and the buried layer 22 becomes less than 90°. It is noted that this type of semiconductor 50F as shown in FIG. 6D could also be combined with buried layer 22 connected to buried layer tap 36 to form a device 450F having a tapered fin type body 24.

The transient time for the transistor having increased on-state drain current but with no change in the off-state drain, from the on-state (with increased drain current) to the off-state (with low off-state drain current), may be improved by limiting excess majority carrier lifetime. During the on-state, the semiconductor device 50 (or 50A, 50F, 150, 350, 450, 450F, 550, 602, 650 or 1750) requires that the body 24 has a large lifetime for body region excess majority carriers to boost the drive current. When the electrons are injected from the source 16 (emitter) to the body 24 (base), most of these electrons are swept in to the buried layer 22 (collector) with some recombining with the base region majority carriers. A small amount of recombination may occur, but a continuous supply of body 24 region majority-carriers is sustained to boost the on-state drive current. Therefore, the transient time for the transistor 50 (or 50A, 50F, 150. 350, 450, 450F, 550, 602, 650 or 1750 and any other embodiments of MOS device described as embodiments of the invention herein) from the on-state to the off-state may be improved by providing a recombination region made by several means that will be described below. However, if the population of these majority carriers is too limited, the operation of vertical BJT 30a (see FIG. 8) is inhibited and subsequently no current boosting will occur. All of the described methods will only alter the majority carrier lifetime while the conductivity type and channel mobility may remain substantially unchanged.

FIG. 7A is a schematic, cross-sectional illustration of a semiconductor device 50 with charge trap layer 27 such as silicon nitride lined in the trench isolation region 26 according to an embodiment of the present invention. Unless noted otherwise features that are described here with regard to device 50 can also be applied to devices 50A, 50F, 150, 350, 450, 450F, 550, 602, 650, 1750 and any other embodiments of MOS device described as embodiments of the invention herein. The charge trap layer 27 is either directly contacted to the sidewall of the body 24 region or indirectly contacted through the very thin interfacial oxide in between (not shown). The charge trap layer 27 such as silicon nitride contains substantial number of charge trap centers that may absorb the excess majority carrier.

FIG. 7B is a schematic, cross-sectional illustration of a semiconductor device 50 with metal silicided junction partially contacting to body 24 region according to an embodiment of the present invention. The metal silicide regions 16A and 18A may contact the body 24 region near the sides of the source 16 and drain 18 region, respectively. Alternatively, the metal silicide 16A is formed only on the source side 16, with no metal silicide region 18A (not shown). The Schottky junction formed by metal silicide region 16A and the body 24 may facilitate the majority carrier recombination.

FIG. 7C is a schematic, cross-sectional illustration of a semiconductor device 50 with junction with energy band offset compared to body region according to an embodiment of the present invention. The energy band offset regions 16B and 18B may contact the body 24 region near the bottoms of the source 16 and drain 18 regions. Alternatively, the energy band offset region 16B may be formed only at the source 16 side, with no energy band offset region 18B being formed (not shown). For an n-type channel MOS, the valence band offset material is embedded in the source 16 and the drain 18 for the excess majority carrier (holes) to be preferentially evacuated through the source 16. For a p-type channel MOS, the conduction band offset material is embedded in the source 16 and the drain 18 for the excess majority carrier (electrons) to be preferentially evacuated through the source 16.

FIG. 7D is a schematic, cross-sectional illustration of a semiconductor device 50 with recombination centers 17 disposed near the junction between source 16 and body 24 and, optionally, between drain 18 and body 24 according to an embodiment of the present invention. One general approach is by doping with deep level impurities, such as gold or platinum. Another general approach is to introduce crystallinity damage through ion implantation through such as Si, Ge, or Ar implantation. Another general approach is by using radiation damage to produce defects in the silicon crystal lattice structure.

The charge recombination regions explained in FIG. 7A to FIG. 7D can be symmetrically formed at both the source 16 and the drain 18 for process convenience. However, these charge recombination regions may also be formed only at the source side region in order to inhibit drive current degradation and junction leakage occurring near the drain side.

The operation of the semiconductor device 50 will be described using an n-channel device as an example. The operation of a p-channel device follows the same principle, but the polarity of the applied voltages will be opposite that of the n-channel device (using the source voltage as the reference). Likewise, the operation of semiconductor devices 50A, 50F, 150, 350, 450, 450F, 550, 602, 650 and 1750 operate like that described with regard to p-channel or n-channel devices 50.

Figure 8:
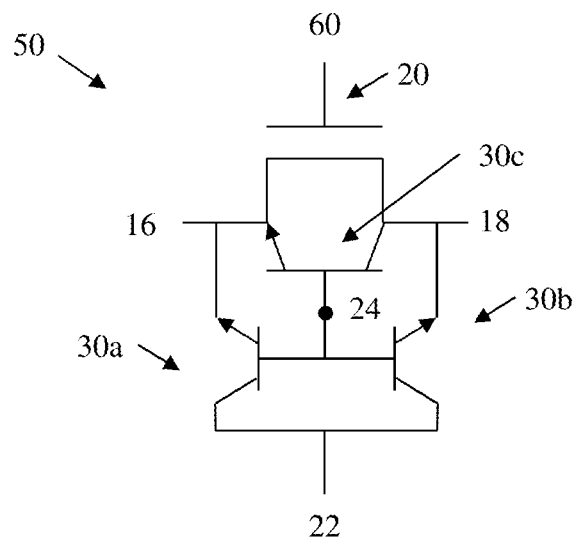
FIG. 8 illustrates an equivalent circuit representing a MOS device according to an embodiment of the present invention.

FIG. 8 illustrates an equivalent circuit representation of semiconductor device 50. Inherent in semiconductor device 50 are metal-oxide-semiconductor (MOS) transistor 20, formed by source 16, gate 60, drain 18, and body 24, and vertical BJTs 30a and 30b, formed by buried layer 22, body 24, and source 16 or drain 18, respectively. Also inherent in semiconductor device 50 is lateral BJT 30c, formed by source 16, body 24, and drain 18.

Figure 9:
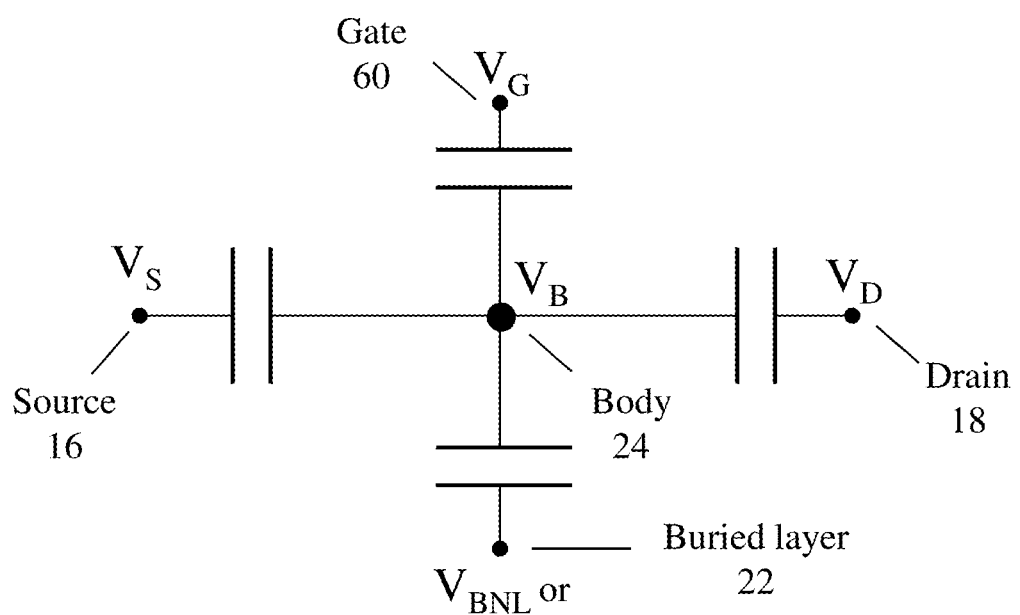
FIG. 9 illustrates an equivalent capacitor circuit model representing a MOS device according to an embodiment of the present invention.

FIG. 9 schematically illustrates an equivalent capacitor circuit representation of semiconductor device 50 shown in FIGS. 1-8. It is noted that this equivalent capacitor circuit would also represent other embodiments of devices described herein according to the present invention, as would be readily apparent to those of ordinary skill in the art after viewing FIG. 9 and reading its description. The body 24 potential ($V_B$) is capacitively coupled with gate oxide capacitance, source side junction capacitance, drain side junction capacitance, and buried layer junction capacitance. Therefore, the body 24 potential ($V_B$) can be perturbed by the gate 60 voltage ($V_G$), source 16 voltage ($V_S$), drain 18 voltage ($V_D$), and buried layer 22 voltage ($V_{BNL}$ for buried n-layer and $V_{BPL}$ for buried p-layer voltage).

Figure 10:
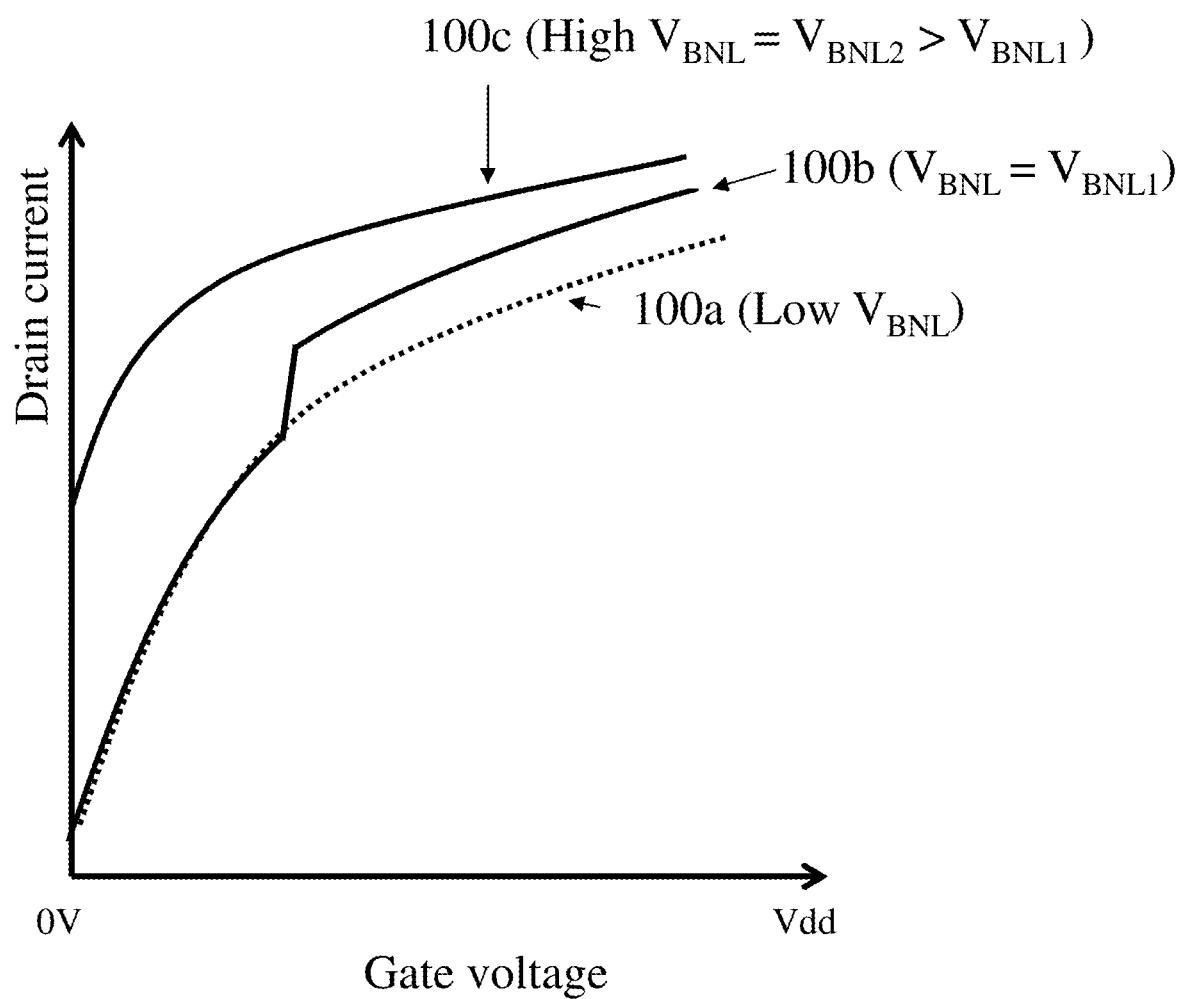
FIG. 10 illustrates drain current versus gate voltage characteristics for various voltages applied to a buried layer, representing a MOS device according to an embodiment of the present invention.

FIG. 10 schematically illustrates drain 18 current versus gate 60 voltage characteristics for various buried layer 22 voltage. In this plot, it is important to note that the applied drain 18 voltage is assumed to be a voltage that does not exceed that which would cause an impact ionization process near the junction between the body 24 and the drain 18. If the voltage applied to the drain region 18 is sufficiently high to cause an impact ionization process near the junction between the body 24 and the drain 18, an increase in the current flow (from the drain region 18 to the source region 16) may also be observed, as described for example in "Hysteresis I-V Effects in Short-Channel Silicon MOSFETs", Boudou, A. and Doyle, B. S., IEEE Electron Device Letters, vol. EDL-8, no. 7, July 1987, or the kink effect observed in the silicon-on-insulator (SOI) wafer as described for example in "Single-Transistor Latch in SOI MOSFETs", Chen, C.-E. D., et al, IEEE Electron Device Letters, vol. 9, no. 12, December 1988, which are hereby incorporated herein, in their entireties, by reference thereto. Because the voltage applied to the drain region 18 to cause an impact ionization process is typically higher than the operating voltage of the transistor, this may result in degradation of the transistor performance and reliability over time.

If the buried layer 22 is biased at low voltage such as zero volts, the drain 18 current versus the gate 60 voltage characteristic 100a shows ordinary MOSFET characteristics.

At high voltage $V_{BNL2}$ applied to the buried layer 22, the semiconductor device 50 will function as a memory device having at least two stable states. If the constant voltage applied to the buried layer 22 is sufficiently high that if body 24 potential is greater than the potential required to turn-on vertical BJT 30a, regardless of the gate 60 and the drain 18 voltages, electron hole pairs are generated near a junction between the body 24 and the buried layer 22 even at the gate voltage of zero. The resulting hot electrons flow into the buried layer 22 while the resulting hot holes will subsequently flow into the body region 24. When the following condition is met: $\beta \times (M-1) \approx 1$—where $\beta$ is the forward common-emitter current gain of the bipolar transistors 30a or 30b and M is the impact ionization coefficient—the amount of holes injected into the body region 24 compensates for the charge lost due to p-n junction forward bias current between the body region 24 and the source line region 16 or bit line region 18 and due to holes recombination. This process maintains the majority charge (i.e. holes) stored in the body region 24 which will keep the n-p-n bipolar transistors 30a and 30b on for as long as a positive bias is applied to the buried well region 22. The state where the body potential is sufficiently high and is maintained by the hole current generated at the junction of body 24 and buried layer 22 is referred to as the latch state of the semiconductor device 50. As shown in the drain 18 current versus gate 60 voltage characteristics for high buried layer 22 voltage 100c of FIG. 10, the lateral BJT 30c current flows even at the zero gate voltage, when the semiconductor device 50 is in latch-state.

If the buried layer 22 is biased at a positive voltage (but less positive than the positive voltage which results in the drain 18 current versus gate 60 voltage characteristics 100c), gate 60 and drain 18 voltages can elevate body 24 potential to be greater than a potential required to turn-on vertical BJT 30a by capacitive coupling. When the vertical BJT 30a is turned on, electrons from source 18 (emitter) flow to the buried layer 22 (collector) of the vertical BJT 30a. The constant voltage applied to the buried layer 22 is enough to cause impact ionization process, and electron hole pairs are generated near a junction between the body 24 and the buried layer 22. The generated electrons are collected by the positively biased buried layer 22, while the generated holes flow into the body 24. These generated holes act as a base current of the lateral BJT 30c, which turns on the lateral BJT 30c. As a result, the on-state drain current becomes the sum of MOS transistor 20 current and lateral BJT 30c current. As shown in the drain 18 current versus gate 60 voltage characteristics for high buried layer 22 voltage 100b of FIG. 10, the on-state drain current is boosted compared to the on-state drain current with the buried layer 22 biased at zero. If desired, the on-state drain current can be further boosted by increasing the voltage applied to the buried layer 22. However, the off-state drain current can be the same as the off-state drain current with the buried layer 22 biased at zero, because the body 24 potential at the gate voltage of zero becomes smaller than the threshold voltage for turning on the vertical BJT 30c. Therefore, at a positive bias $V_{BNL1}$ (less positive than the positive voltage $V_{BNL2}$ which results in a latch state at zero gate voltage), semiconductor device 50 functions as a boosted transistor with increased on-state drain current, but with no change in the off-state drain current. Also notice that the drain 18 current versus gate 60 voltage characteristics of 100b exhibits a steep slope (<60 mV/dec) when at the gate 60 voltage when the lateral BJT 30c is first activated.

Figure 11:
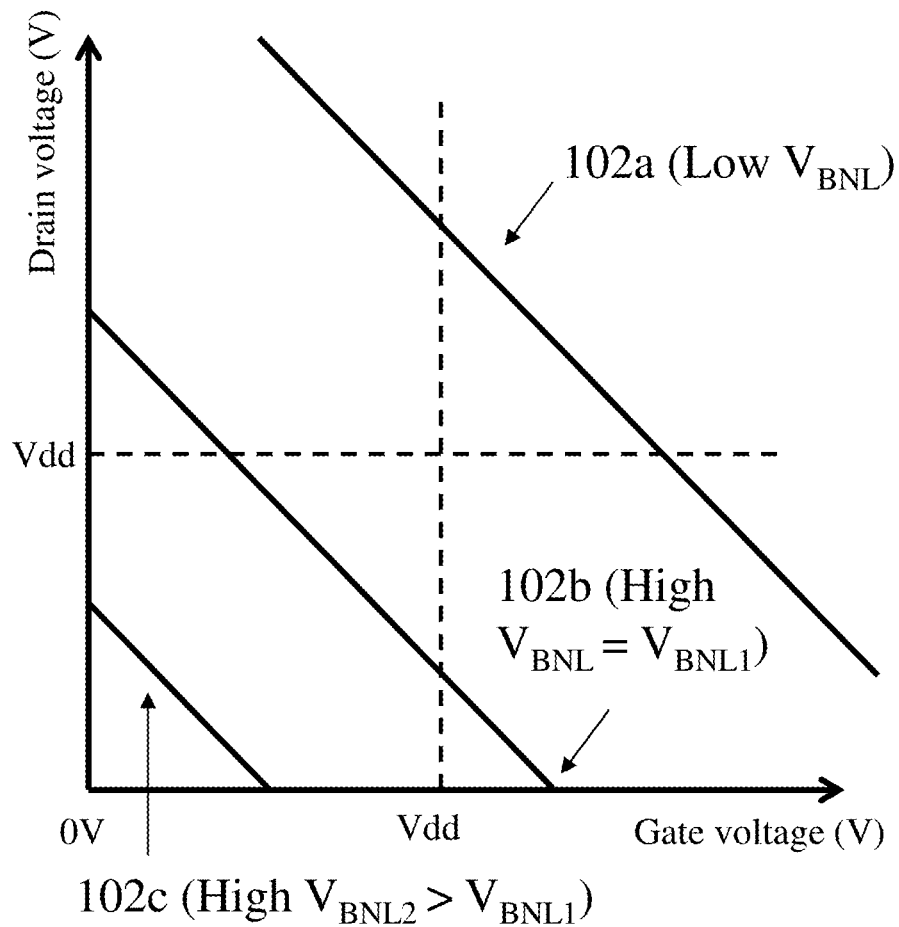
FIG. 11 illustrates minimum gate and drain voltage to activate an intrinsic lateral BJT for different voltages applied to a buried layer, representing a MOS device according to an embodiment of the present invention.

When the constant voltage applied to the buried layer 22 is less than a voltage to cause an impact ionization process near the junction between the buried layer 22 and the body 24, no lateral BJT 30c action takes place at any body 24 potentials. For a constant voltage applied to the buried layer 22 that is greater than or equal to that required to cause an impact ionization process, FIG. 11 represents the drain 18 voltage and gate 60 voltage that start to form body 24 potential to turn on the lateral BJT 30c. In other words, the lines (102a, 102b, and 102c) indicate the minimum gate 60 and drain 18 voltages to activate the lateral BJT 30c at a given buried layer 22 voltage. The voltages at upper and right region of the line causes the lateral BJT 30c to be turned on. A line may locate above power supply voltage Vdd for a low voltage applied to the buried layer 22 (for example, line 102a). In this case, no lateral BJT would be activated within the normal operation voltage ranging from 0V to Vdd. For a very high voltage applied to the buried layer 22, a line may locate inside Vdd (for example, line 102c). In this case, the lateral BJT 30c is activated even at gate 60 voltage of zero. For some high voltage applied to the buried layer 22, a line (for example, line 102b) may intersect to the Vdd lines (dotted lines). In this case, the lateral BJT 30c is activated even at gate 60 voltage of Vdd, but the lateral BJT 30c can be turned off at gate 60 voltage of zero. Therefore, various operations can be attained according to the desired characteristics.

Particularly, when the semiconductor device 50 is biased to exhibit the drain 18 current versus gate 60 voltage characteristics showing a boosted on-state drain current as shown in 100b of FIG. 10, the semiconductor device 50 is hereinafter referred as boosted transistor 50. Likewise semiconductor devices 50A, 50F, 150, 350, 450, 450F, 550, 602, 650 and 1750 having a boosted on-state drain current can be referred to as boosted transistors 50A, 50F, 150, 350, 450, 450F, 550, 602, 650 and 1750.

Several operations can be performed by semiconductor device 50 having increased on-state drain current, but with no change in the off-state drain current. When a supply voltage (Vdd) such as 1.0 volt is applied to the gate 60 and the drain 18, depending on the voltage applied to the buried layer 22, both MOS transistor 20 and lateral BJT 30c can be turned on, which results in higher on-state drain current than the conventional MOSFET, or MOS transistor 20 can be turned on while the lateral BJT 30c is turned off, which results in the same on-state drain current compared to the conventional MOSFET. When zero volts is applied to the gate 60 and Vdd such as 1.0 volt is applied to the drain 18, MOS transistor 20 can be turned off while the lateral BJT 30c is turned on, which results in a high off-state drain leakage current, or both MOS transistor 20 and lateral BJT 30c can be turned off, which results in lowest off-state drain current. According to an embodiment of the present invention, aforementioned various operational states can be determined by different levels of voltage applied to the buried layer 22. The switching between on and off of MOS transistor 20 is associated with a voltage applied to gate 60. The switching between on and off of lateral BJT 30c is associated with voltages applied to gate 60 and buried layer 22.

In one particular non-limiting embodiment, $V_{BNL2}$ is about +2.0 volts, $V_{BNL1}$ is about +1.5 volts, and low $V_{BNL}$ is a positive voltage lower than $V_{BNL1}$. However, these voltage levels may vary, while maintaining the relationship that $V_{BNL2}$ is more positive than $V_{BNL1}$. These voltage levels may depend for example on the doping profile and the depth of the buried layer region 22.

Figure 12A:
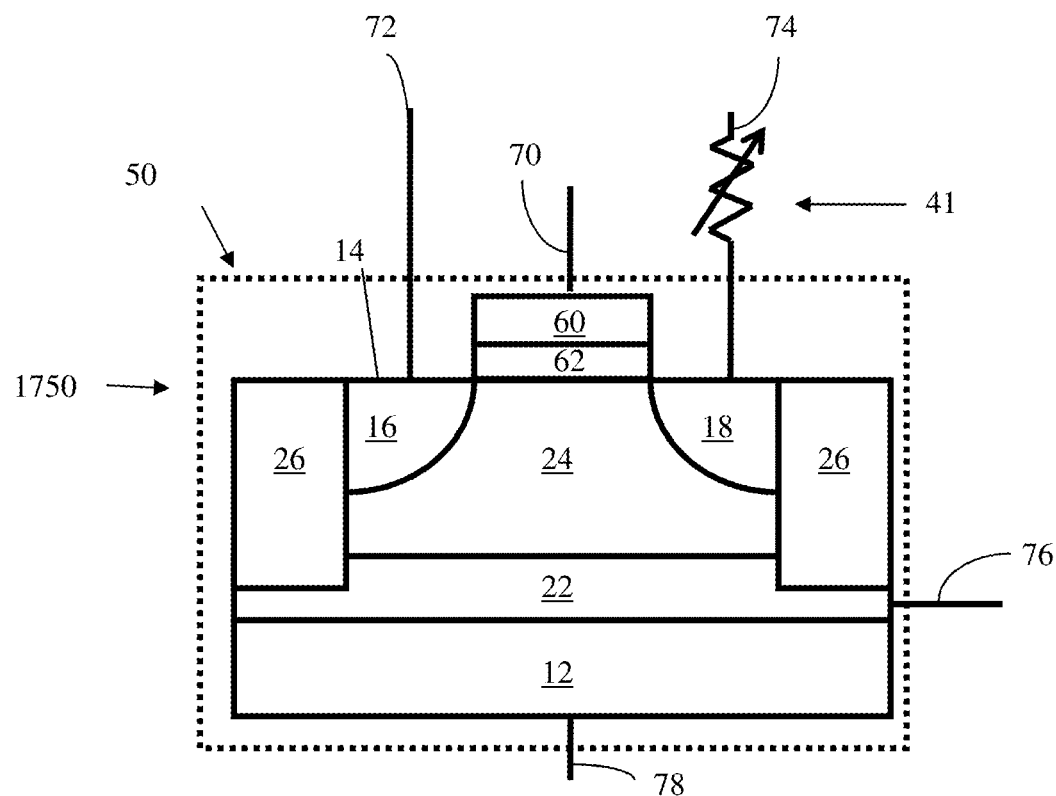
FIG. 12A is a schematic, cross-sectional illustration of a semiconductor memory device comprising a semiconductor device as a memory select transistor and a memory element according to an embodiment of the present invention.
Figure 12B:
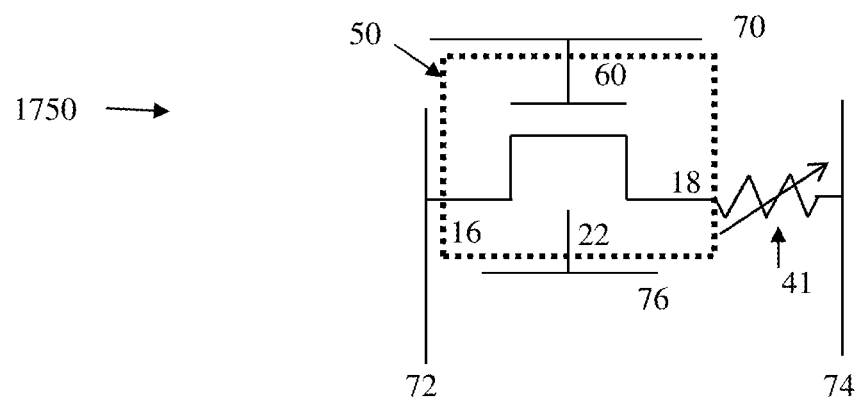
FIG. 12B is an equivalent circuit representing the semiconductor memory device of FIG. 12A.

FIGS. 12A and 12B illustrate a schematic cross-sectional view of a semiconductor memory device 1750 and an equivalent circuit, respectively, according to another embodiment of the present invention. The semiconductor memory device 1750 is a volatile or non-volatile memory cell comprising a boosted transistor 50 and a two terminal memory element 41. The semiconductor memory device 1750 includes five terminals: word line (WL) terminal 70, source line (SL) terminal 72, bit line (BL) terminal 74, buried layer (BW) terminal 76, and substrate terminal (SUB) 78. WL terminal 70 is connected to gate 60. SL terminal 72 is connected to the source 16 and BL terminal 74 is connected to drain 18. BW terminal 76 is connected to buried layer 22. Substrate terminal 78 is connected to substrate 12 below buried layer 22. For simplicity, the substrate terminal is not drawn in FIG. 12B. The memory element 41 has two terminals where one terminal is connected to the drain 18 of the boosted transistor 50 and another terminal is connected to BL terminal 74.

The memory element 41 is shown as a variable resistor which resistance value is controlled by previously applied bias condition, and may be formed from resistive switching memory (known as resistive random access memory (RRAM or ReRAM), memristor, conductive bridge memory (CBRAM), phase change memory (also known as PCM, PCRAM), chalcogenide memory (CRAM)), magnetoresistive memory (MRAM). The memory element 41 material may take the form of metal-insulator-metal structure, in which transition metal oxide or perovskite metal oxide is used in conjunction with any reasonably good conductors, for example as described in "Overview of Phase-Change Chalcogenide Non-volatile Memory Technology", S. Hudgens and B. Johnson, MRS Bulletin, vol. 29, issue 11, November 2004, p. 829-832, "Phase Change Memory", Wong, H.-S. P. et al., Proceedings of the IEEE, vol. 98, no. 12, December 2010, pp. 2201-2227, "Nanoionics-based resistive switching memories", R. Waser and M. Aono, Nature Materials, vol. 6, November 2007, pp. 833-840, and "Metal-Oxide RRAM", Wong, H.-S. P. et al., Proceedings of the IEEE, vol. 100, no. 6, June 2012, pp. 1951-1970, all of which are hereby incorporated herein, in their entireties, by reference thereto. The state of the semiconductor memory device 1750 is determined by the resistivity of the memory element 41. The memory element 41 is written (from a low resistivity state to a high resistivity state and vice versa) by flowing an electrical current through the memory element 41.

In the case of phase change materials, this involves the change of the crystallinity of the chalcogenide materials from crystalline state to amorphous state, while in metal oxide materials, this typically involves the annihilation of conductive filaments. Alternatively, the memory element 41 material may take the form of magnetic storage elements formed from two ferromagnetic plates, each of which can hold a magnetization, separated by a thin insulator layer, known as magnetic tunnel junction (MTJ) as described in "A 4-Mb toggle MRAM based on a novel bit and switching method", Engel, B. N., Akerman, J., Butcher, B., Dave, R. W., DeHerrera, M., Durlam, M., Grynkewich, G., Janesky, J., Pietambaram, S. V., Rizzo, N. D. and Slaughter, J. M., 2005 IEEE Transactions on Magnetics, 41(1), pp. 132-136, "Progress and outlook for MRAM technology, Tehrani, S., Slaughter, J. M., Chen, E., Durlam, M., Shi, J. and DeHerren, M., 1999 Progress and outlook for MRAM technology. IEEE Transactions on Magnetics, 35(5), pp. 2814-2819, "Spin-transfer torque MRAM (STT-MRAM): Challenges and prospects", Huai, Y., 2008 AAPPS bulletin, 18(6), pp. 33-40, "Recent developments in magnetic tunnel junction MRAM", Tehrani, S., Engel, B., Slaughter, J. M., Chen, E., DeHerrera, M., Durlam, M., Naji, P., Whig, R., Janesky, J. and Calder, J., 2000. IEEE Transactions on magnetics, 36(5), pp. 2752-2757, "Circuit and microarchitecture evaluation of 3D stacking magnetic RAM (MRAM) as a universal memory replacement", Dong, X., Wu, X., Sun, G., Xie, Y., Li, H. and Chen, Y., Design Automation Conference 2008, 2008 45th ACM/IEEE (pp. 554-559). IEEE, all of which are hereby incorporated herein, in their entireties, by reference thereto.

The boosted transistor 50 is used as a select device for the memory element 41. The memory element 41 may be connected directly on the drain 18 region of the boosted transistor 50. Alternatively, the memory element 41 may be formed on a number of metal layers interposed by inter-layer-dielectric (ILD) on top of the boosted transistor 50.

Application of back bias to buried layer 22 of the boosted transistor 50 may turn on the vertical bipolar devices formed by source region 16 or drain region 18, body region 24, and buried layer 22, and enhance the current flow through the semiconductor device 50. As a result, the write operations of the boosted transistor 1750 may be enhanced. The increased efficiency of the write operations may be used to increase the operating speed, or to lower the voltage applied for the write operations, reducing the transistor channel width, or reducing the operating power of the semiconductor memory device 1750.

In one embodiment, if one set of voltage pulses is applied to the memory element 41 through the boosted transistor 50, the resistance of memory element 41 is increased or the memory element 41 is written to high resistance state (HRS). If another set of voltage pulses is applied to the memory element 41 through the boosted transistor 50, the resistance of memory element 41 is decreased or the memory element is written to low resistance state (LRS). The voltage pulses for the writing logic '1' and logic '0' may have opposite polarity. Alternatively, the voltage pulses for the writing logic '1' and logic '0' may have the same polarity but different pulse amplitude or pulse width. The voltage pulse for each writing operation may be optimized by changing pulse amplitude and pulse width. The HRS may range from 50 kilo-ohm to 100 mega-ohm and the LRS may range from 1 ohm to 10 kilo-ohm. The amount of current required to switch the resistance of the memory element 41 depends on the material, the memory element thickness, and the area of the memory element. Application of back bias to buried layer 22 of the semiconductor device 50 enhances the current flow through the boosted transistor 50 and therefore increases the efficiency of the write operation, thereby relatively reducing the amount of voltage or current that would otherwise be necessary to perform the write operation. In one embodiment, the back bias may be applied during the write operation and then removed after the completion of the write operation.

In one embodiment, a memory element 41 may require a forming process to be performed prior to an initial operation. The forming operation requires a higher voltage or current than that which is used during normal operations for setting the resistance states. It is desirable to reduce the voltage or current necessary for the forming process to as low a level as possible. Application of back bias to buried layer 22 of the semiconductor device 50 enhances the current flow through the boosted transistor 50 and therefore increases the efficiency of the forming process, thereby relatively reducing the amount of voltage or current that would otherwise be necessary to perform the forming operation. In one embodiment, the back bias may be applied during the forming operation and then removed after the completion of the forming operation.

Figure 13:
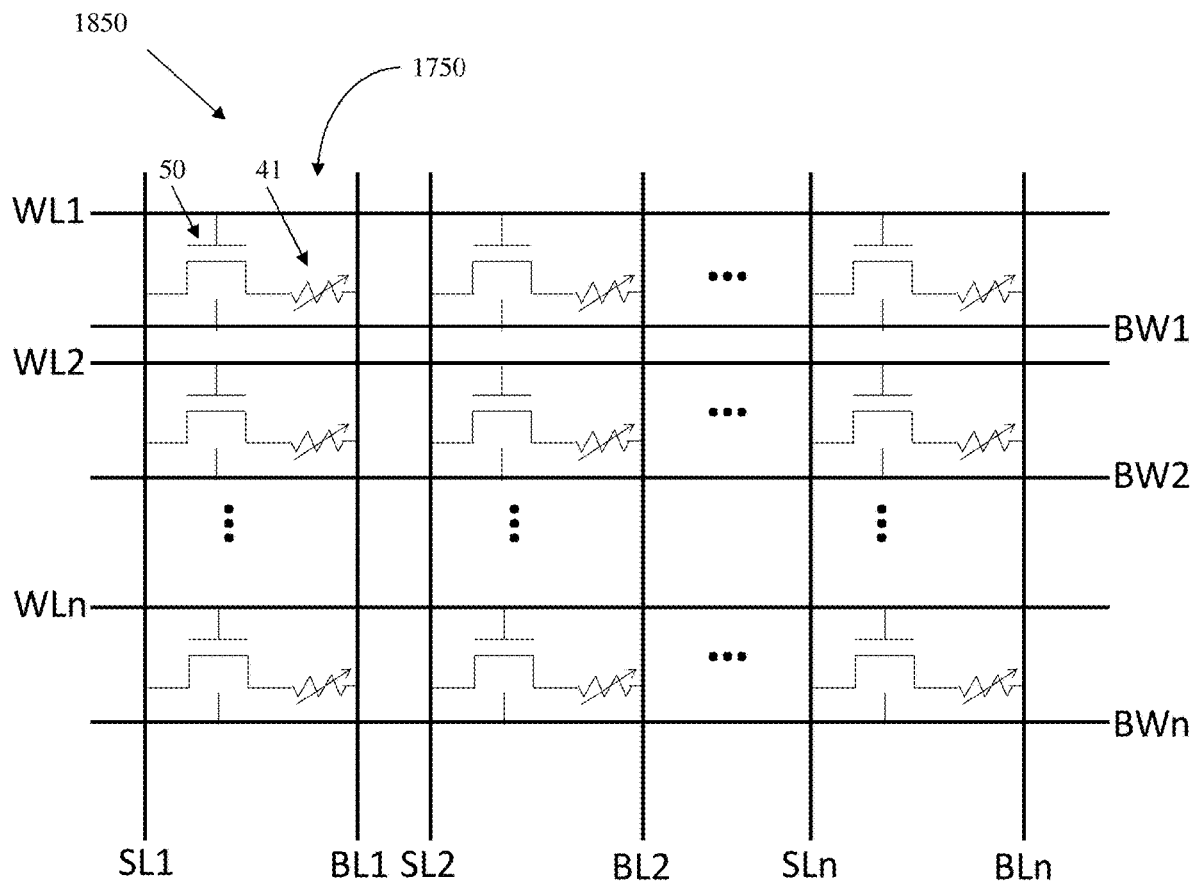
FIG. 13 is a schematic illustration of a semiconductor memory device array comprising a configuration of unit cells of 1-boosted transistor and 1-memory element (1T1M) each.

FIG. 13 is a schematic illustration of an array 1850 comprising a plurality of semiconductor memory devices 1750. The unit cell 1750 of the memory array utilizes a 1-boosted transistor 50 and 1-memory element 41 configuration (1T1M). The memory array 1850 includes columns of bit lines BL1-BLn, columns of source lines SL1-SLn, and rows of word lines WL1-WLn. Additionally, the memory array 1850 may include rows of buried well layer lines BW1-BWn, or the buried well layer may also be common for all of the memory array 1850 or for a sub-array of the array 1850. In another embodiment, the SL1-SLn may also be running in the same direction of WL1-WLn. It should be understood that the memory array is shown as 3×3 sub-array chain, but may be sized as desired such as 128×128 sub-array, or other configuration.

Figure 14:
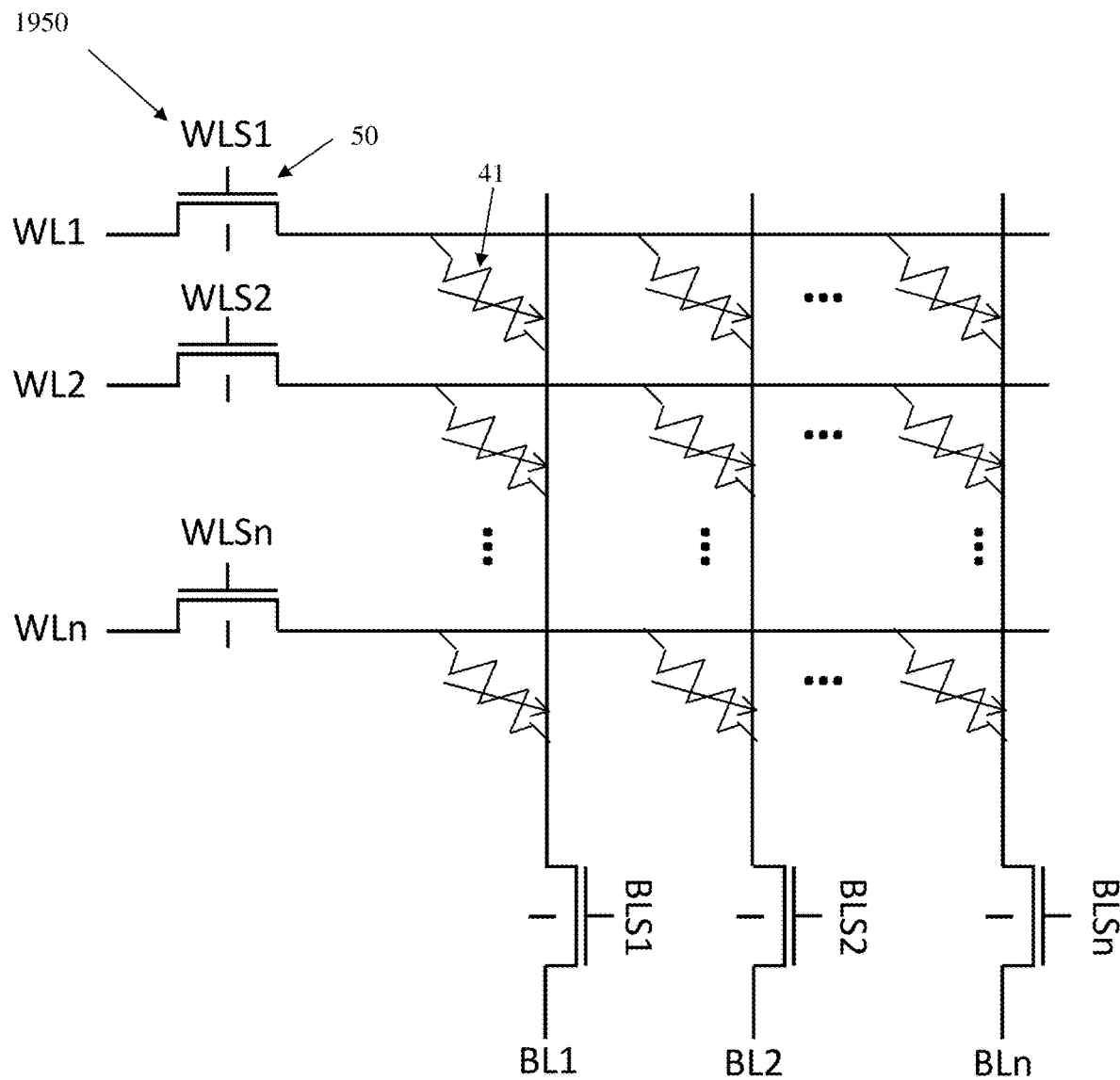
FIG. 14 is a schematic illustration of a semiconductor memory device array comprising 1-boosted transistor and n-memory element (1TnM) configuration, according to an embodiment of the present invention.

FIG. 14 is a schematic illustration of a semiconductor memory device array 1950 comprising 1-boosted transistor 50 and n-memory elements 41 (1TnM, wherein "n" is a positive integer, typically greater than 1) configuration according to an embodiment of the present invention. Referring to FIG. 14, the memory array 1950 comprises a plurality of memory elements 41, each associated with one of word line select (WLS) transistor and one of bit line select (BLS) transistor. The memory array includes columns of bit lines BL1-BLn supplied through BLS1-BLSn and rows of word lines WL1-WLn supplied through WLS1-WLSn. The boosted transistor 50 herein is assigned for WLS transistor and BLS transistor. The WL voltage and BL voltage are supplied to the memory element 41 by activating WLS and BLS transistors respectively. According to another embodiment of the present invention, only BL voltages are supplied through the boosted BLS transistors 50 or only WL voltages are supplied through the boosted WLS transistors 50 (not drawn).

Figure 15:
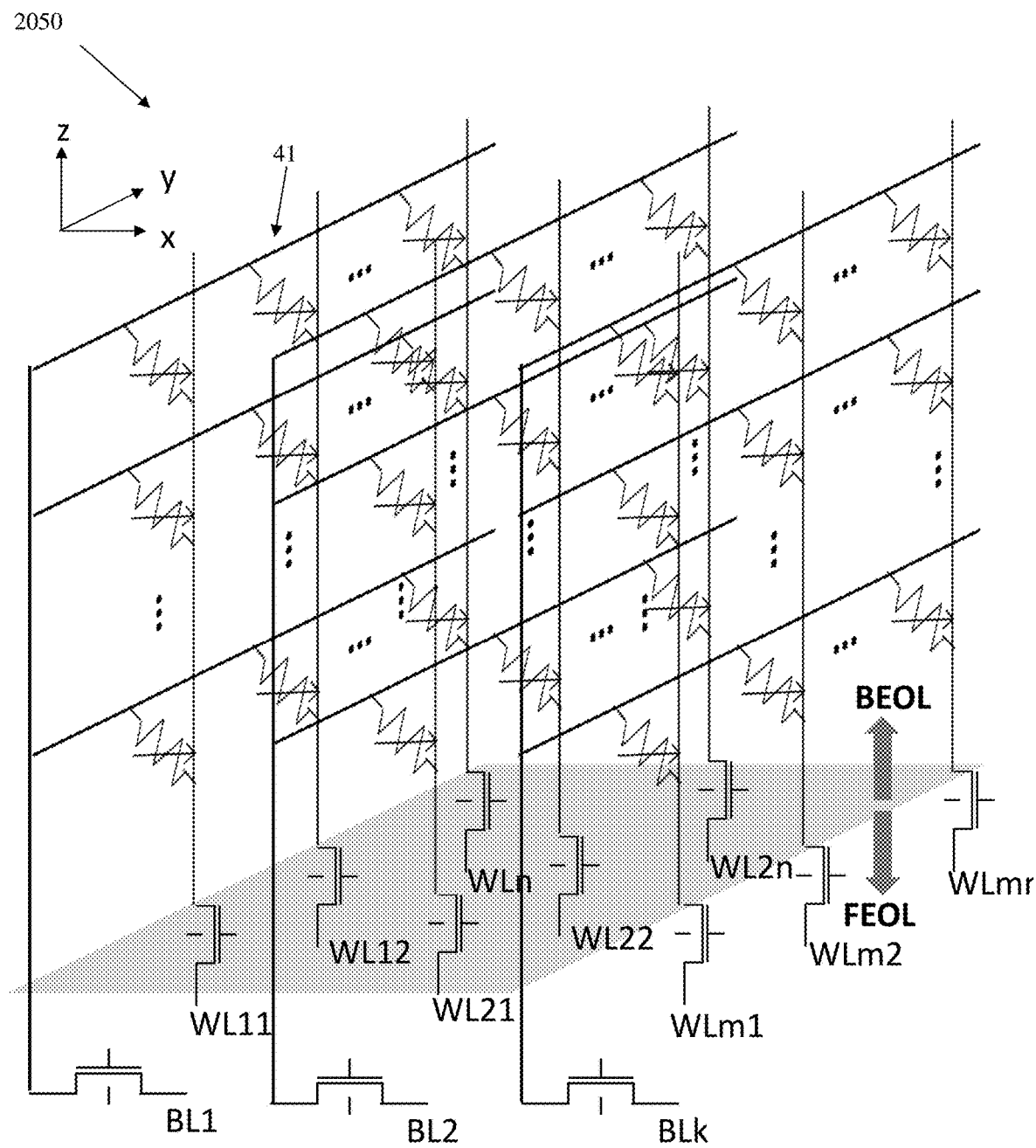
FIG. 15 is a schematic of three-dimensionally stacked 1-boosted transistor and n-memory element (1TnM) configuration according to another embodiment of the present invention.

FIG. 15 is a semiconductor memory device array 2050 comprising three-dimensionally stacked 1-boosted transistor and n-memory element (1TnM) configuration according to an embodiment of the present invention. Referring to FIG. 15, the memory array 2050 comprises a plurality of memory elements 41 formed in a portion of back-end-of-line (BEOL) layers, each associated with one of word line select transistors (not drawn) and one of bit line select transistors formed in a portion of front-end-of-line (FEOL) layers. The WL voltage and BL voltages are supplied to the memory element 41 by activating WLS and BLS transistors respectively. At least one of WLS and BLS transistors are boosted transistor 50. The WLS and BLS boosted transistors are included in the substrate (XY plane).

Figure 16:
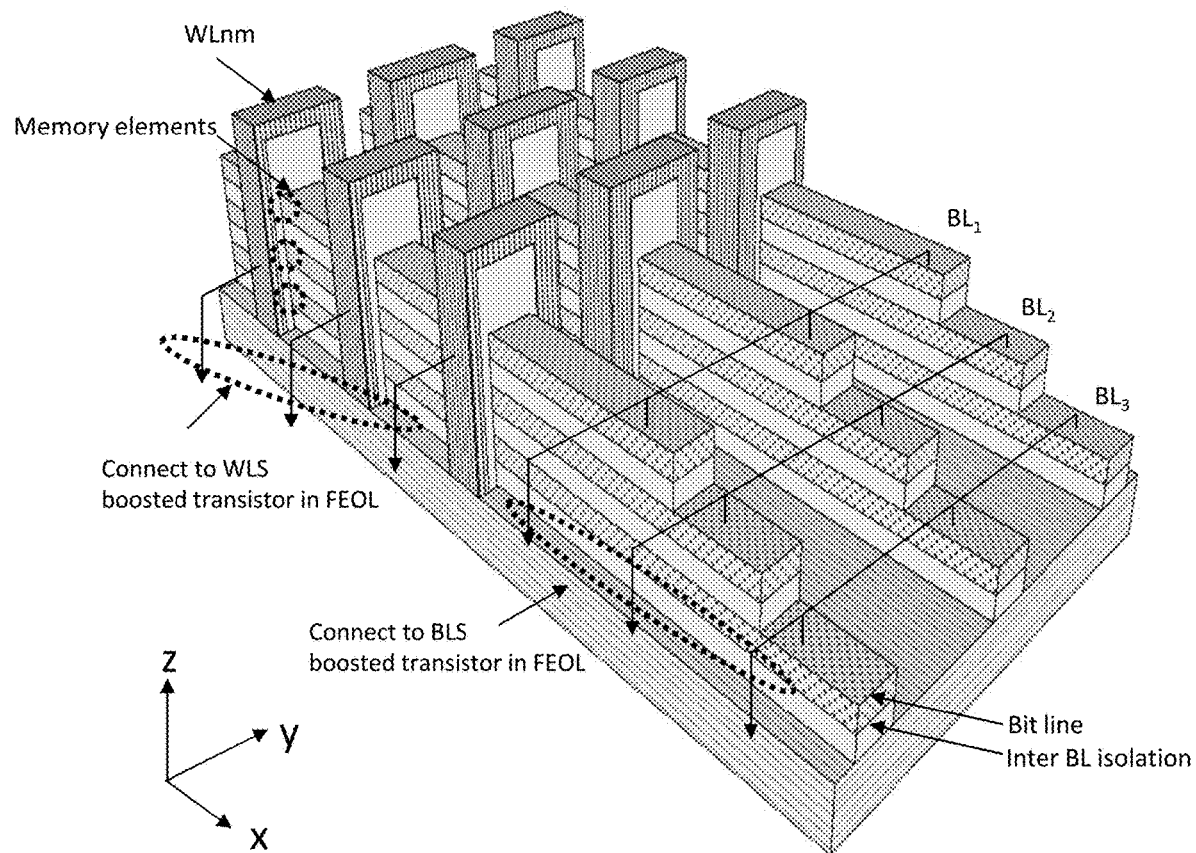
FIGS. 16-18 are exemplary illustrations of three-dimensionally stacked 1-boosted transistor and n-memory element (1TnM) configurations, according to embodiments of the present invention.

FIG. 16 is a three-dimensionally stacked 1-boosted transistor and n-memory element (1TnM) configuration according to an embodiment of the present invention. Referring to FIG. 16, the bit lines $BL_1$, $BL_2$, $BL_3$ are horizontally extending in the X-direction and the word line is vertically extending in the Z-direction, where the vertical word line is wrapping around the sidewall of horizontally arranged bit line with memory element therebetween. The vertical word lines are arranged in a grid pattern. The memory elements are formed in regions where the vertical and horizontal lines cross.

Figure 17:
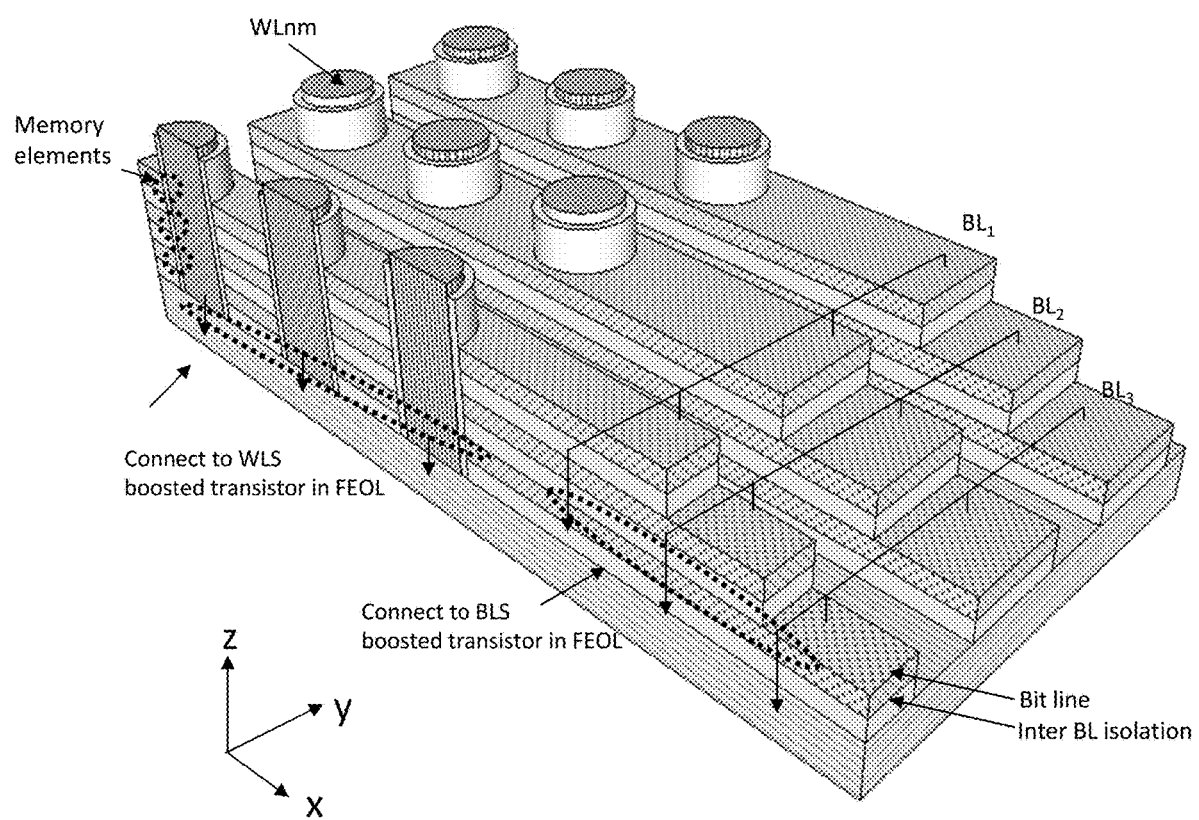

FIG. 17 is a three-dimensionally stacked 1-boosted transistor and n-memory element (1TnM) configuration according to an embodiment of the present invention. Referring FIG. 17, the bit lines are horizontally extending in the X-direction and the word line is vertically extending in the Z-direction such as pillar electrode, where the vertical word line is punching through the horizontally arranged bit line with memory element therebetween. The vertical word lines are arranged in a grid pattern. The memory elements are formed in regions where the vertical and horizontal lines cross.

Figure 18:
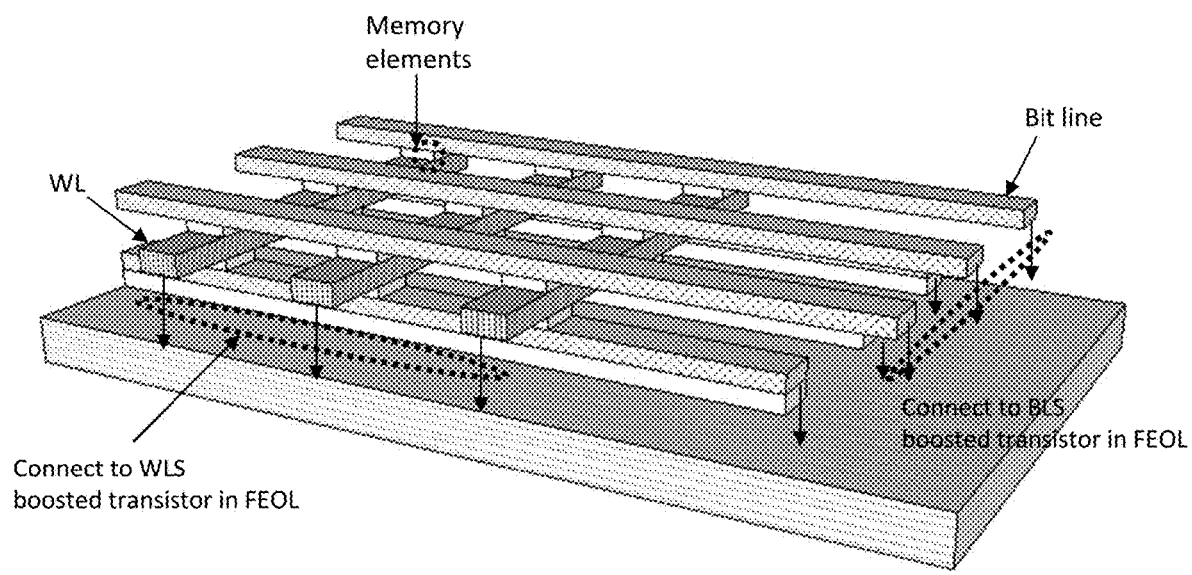

FIG. 18 is a three-dimensionally stacked 1-boosted transistor and n-memory element (1TnM) configuration according to an embodiment of the present invention. Referring FIG. 18, the bit lines are horizontally extending in the X-direction and the word line is also horizontally extending in Y-direction, perpendicular to bit line direction. The memory elements are formed in cross-point regions where the bit lines and word lines cross. Therefore, the cross-point regions are arranged in a grid pattern in XY plane. The cross-points arrangement in XY plane is repeated at least twice along Z-direction.

Figure 19:
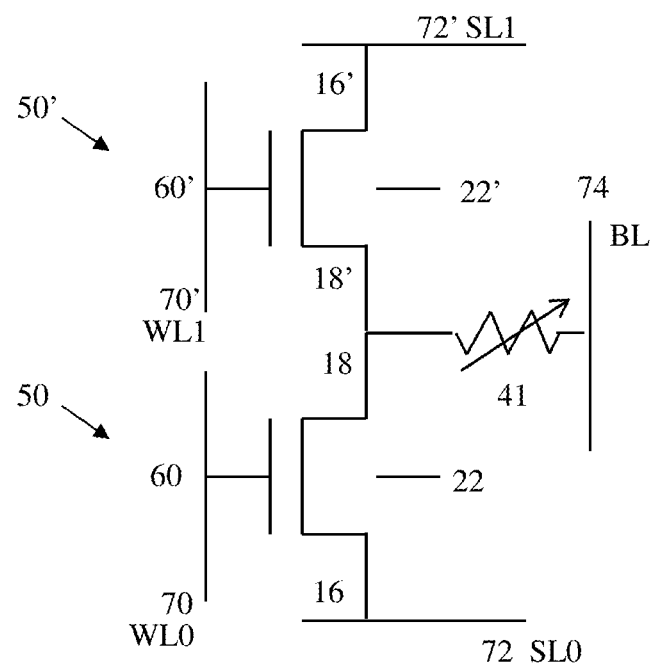
FIG. 19 is an equivalent circuit representing a semiconductor memory device having two select boosted transistors with one memory element allowing dual-port memory according to an embodiment of the present invention.

FIG. 19 is an equivalent circuit representing a semiconductor memory device having two select boosted transistors 50, 50' with one memory element 41 allowing dual-port memory according to an embodiment of the present invention. In some memory usage, the read and write operation to the same column can be accomplished at the same time via different ports.

Figure 20:
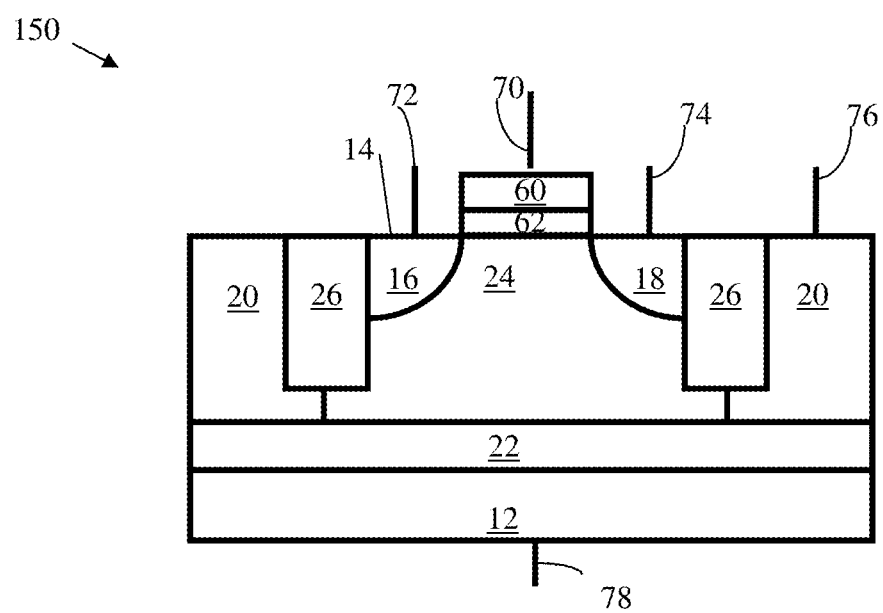
FIG. 20 is a schematic, cross-sectional illustration of a MOS device according to another embodiment of the present invention.

FIG. 20 illustrates a semiconductor device 150 according to another embodiment of the present invention. Similar to semiconductor device 50, semiconductor device 150 may operate as a boosted transistor or a memory cell. The buried layer region 22 of semiconductor device 150 is located below the insulating region 26. The floating body region 24 of semiconductor device 150 is also bounded by adjacent well region 20 of a second conductivity type, such as n-type, for example. The floating body region 24 of the semiconductor device 150 may be bounded by adjacent well region 20 of the second conductivity type by four sides of the floating body region 24 or two sides along channel length direction or two sides along channel width direction of the floating body region 24.

The operation of boosted transistor 150 is similar to that of boosted transistor 50. The back bias applied to the buried layer region 22 (through BW terminal 76) may be higher for boosted transistor 150 than that of boosted transistor as the base region of the vertical bipolar device formed by source/drain regions 16 and 18, floating body region 24, and buried layer 22 is wider for boosted transistor 150 than that of boosted transistor 50.

Figure 21A:
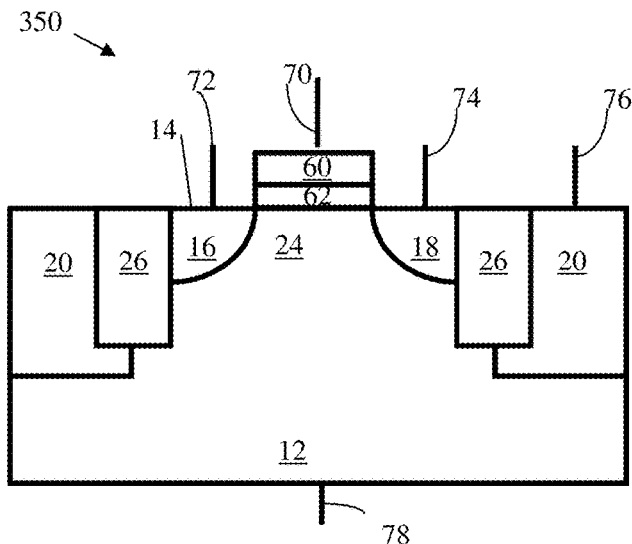
FIG. 21A is a schematic, cross-sectional illustration of a MOS device according to another embodiment of the present invention, wherein the sectional illustration is cut along the gate length of the device.
Figure 21B:
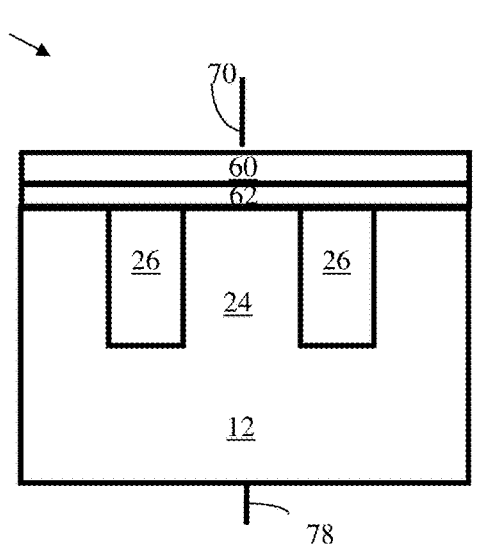
FIG. 21B is a schematic, cross-sectional illustration of the MOS device of FIG. 21A, but where the sectional illustration is cut along the gate width of the device.

FIGS. 21A-21B illustrate semiconductor device 350 (with illustrations cut along the gate length and the gate width, respectively) according to another embodiment of the present invention. Similar to semiconductor device 50, semiconductor device 350 may operate as a boosted transistor or a memory cell. The body region 24 of semiconductor device 350 is also bounded by well region 20 of a second conductivity type, such as n-type, for example. The well region 20 may be formed at only two sides along gate width direction. However, the body region 24 of semiconductor device 350 is not physically bounded at the bottom by a buried layer region. As illustrated in FIG. 21, in the absence of voltage bias applied to the semiconductor device 350, the body region 24 of semiconductor device 350 is electrically connected to the substrate region 12.

Figure 22A:
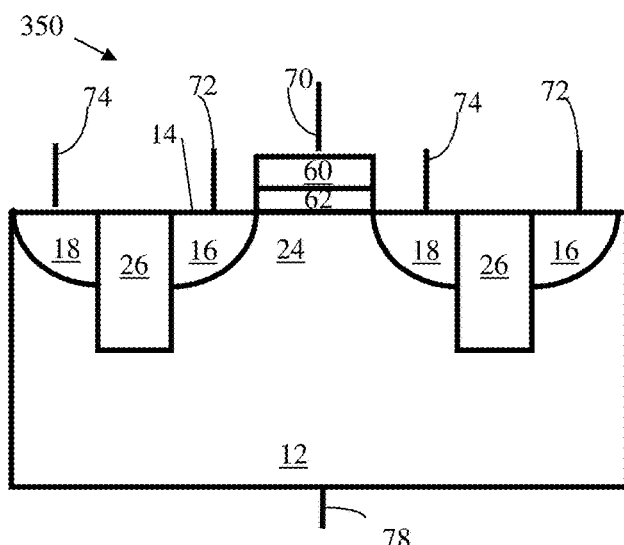
FIG. 22A is a schematic, cross-sectional illustration of a MOS device according to another embodiment of the present invention, wherein the sectional illustration is cut along the gate length of the device.
Figure 22B:
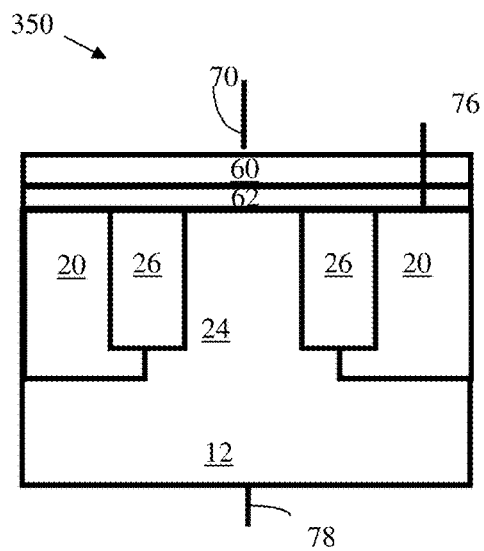
FIG. 22B is a schematic, cross-sectional illustration of the MOS device of FIG. 22A, but where the sectional illustration is cut along the gate width of the device.
Figure 23A:
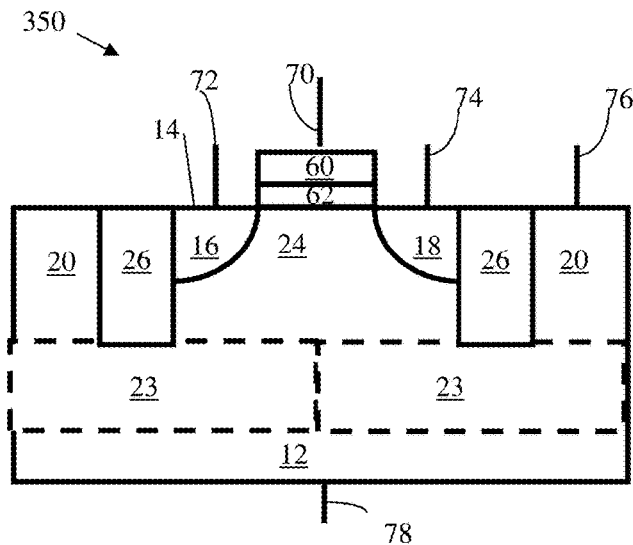
FIG. 23A schematically illustrates a depletion region that is formed as a result of a bias condition applied to the memory cell of FIG. 21A.
Figure 23B:
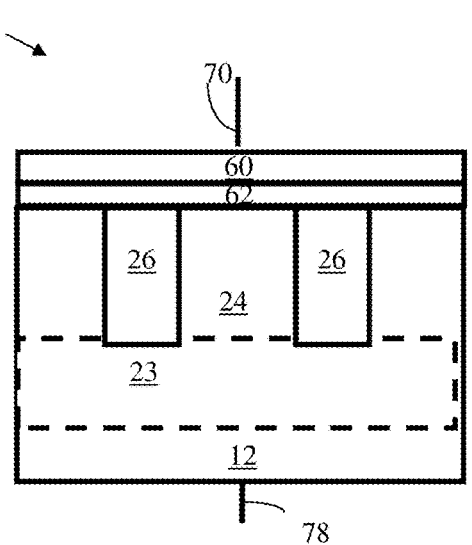
FIG. 23B schematically illustrates a depletion region that is formed as a result of a bias condition applied to the memory cell of FIG. 21B.
Figure 24A:
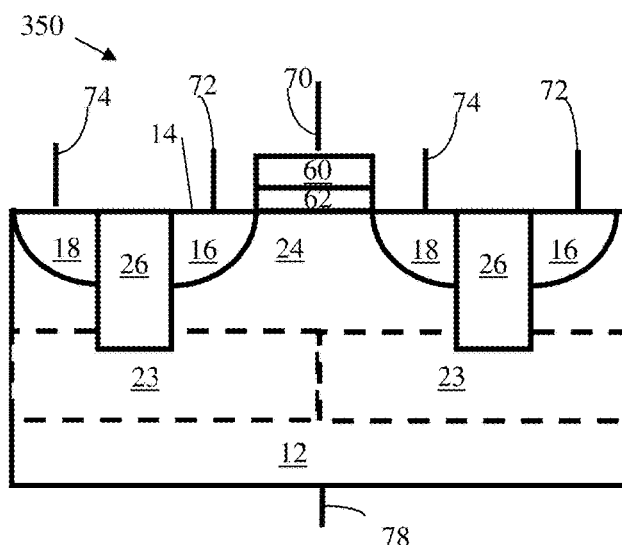
FIG. 24A schematically illustrates a depletion region that is formed as a result of a bias condition applied to the memory cell of FIG. 22A.
Figure 24B:
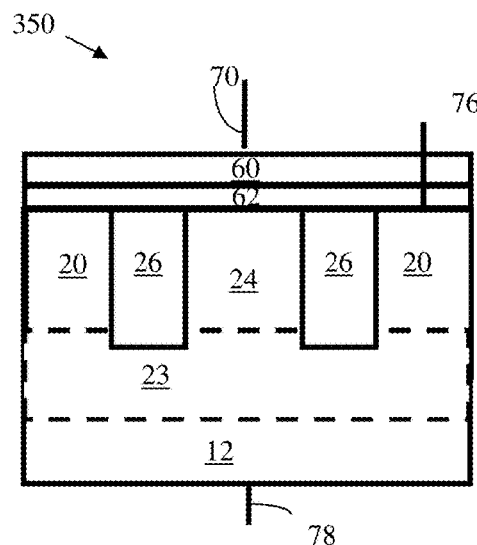
FIG. 24B schematically illustrates a depletion region that is formed as a result of a bias condition applied to the memory cell of FIG. 22B.

FIGS. 22A-22B illustrate semiconductor device 350 (with illustrations cut along the gate length and the gate width, respectively) according to another embodiment of the present invention. The body region 24 of semiconductor device 350 is also bounded by well region 20 of a second conductivity type, such as n-type, for example. The well region 20 may be formed at only two sides along gate width direction. However, the body region 24 of semiconductor device 350 is not physically bounded at the bottom by a buried layer region. As illustrated in FIGS. 22A-22B, in the absence of voltage bias applied to the semiconductor device 350, the body region 24 of semiconductor device 350 is electrically connected to the substrate region 12.

As illustrated in FIGS. 23A-23B and 24A-24B, upon application of a back bias to the well region 20 (through terminal 76), a depletion region 23 (enclosed in dashed lines) is formed in the junction of the body region 24 and the well region 20. It should be understood that the shape of depletion region boundary shown in FIGS. 23-23B and 24A-24B are for illustration purpose only. Rather, it should be understood that it conceptually illustrates the depletion boundaries from left and right well regions 20 merge and result in the body 24 to be floating. Depletion region 23 may extend into the body region 24 due to the reverse biased p-n junctions, and form an isolation for the body region 24. Therefore, the body region 24 of the boosted transistor 350 is now floating and is now isolated from that of adjacent boosted transistors 350. The body region 24 now forms a potential well which can store charge.

Figure 25:
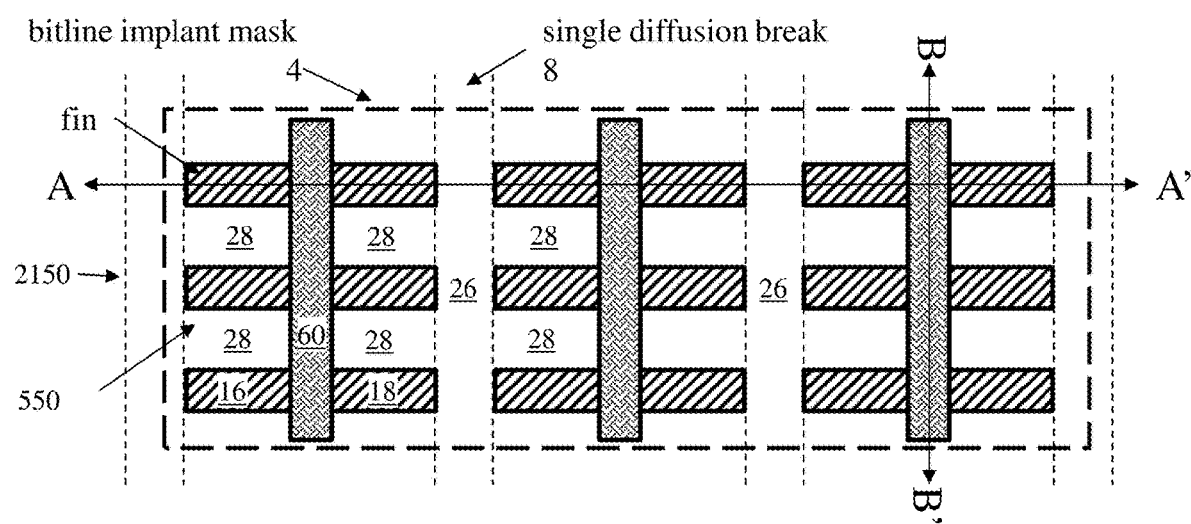
FIG. 25 is a schematic, top layout view of a memory array according to an embodiment of the present invention.
Figure 26:
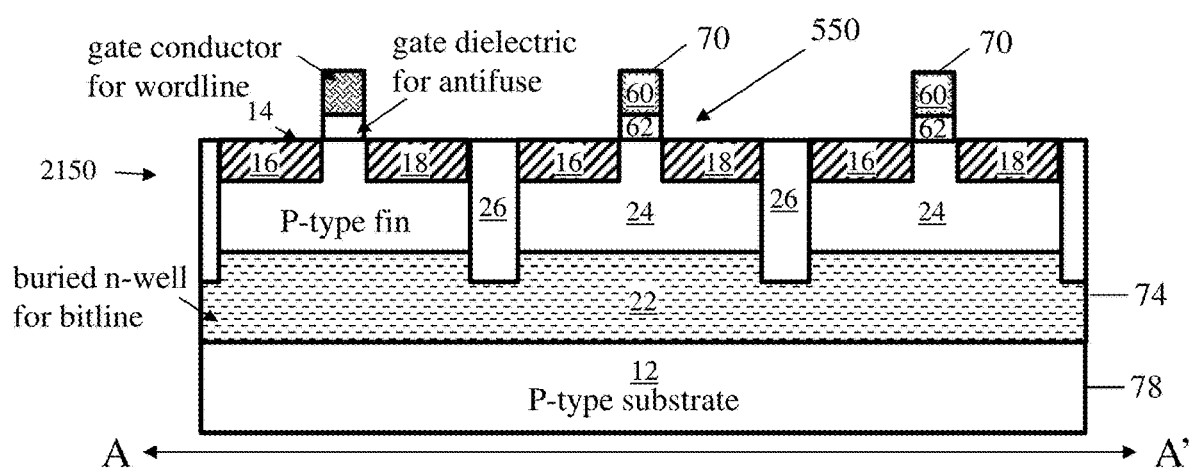
FIG. 26 is a schematic, cross-sectional illustration of the memory array of FIG. 25 cut along the bitline direction, line A-A'.
Figure 27:
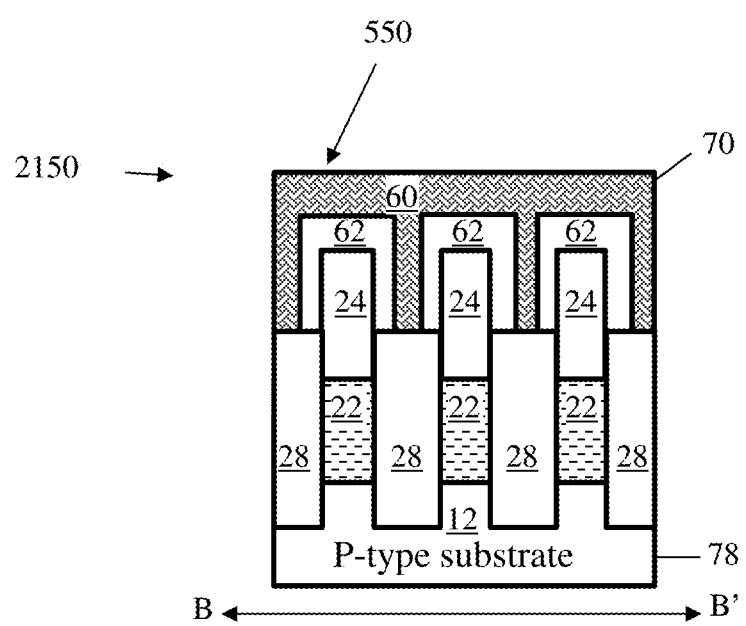
FIG. 27 is a schematic, cross-sectional illustration of the memory array of FIG. 25 cut along the wordline direction, line B-B'.

FIG. 25 illustrates a top plane view of an array 2150 of memory cells 550 according to another embodiment of the present invention. FIG. 26 illustrates a cross-section view of the array 2150 of FIG. 25 cut along line A-A'. FIG. 27 illustrates a cross-section view of the array 2150 cut along line B-B' in FIG. 25. FIGS. 25 to 27 illustrate a 3×3 memory array 2150, but the memory array size is not limited to 3×3.

Semiconductor memory cell 550 includes a substrate 12 of a first conductivity type such as p-type, for example. Substrate 12 is typically made of silicon, but may also comprise, for example, germanium, silicon germanium, gallium arsenide, and/or other semiconductor materials. Memory cell 550 also includes a buried layer 22 of a second conductivity type, such as n-type, for example; a body 24 of the first conductivity type, such as p-type, for example; and source/drain regions 16 and 18 of the first or the second conductivity type. Alternatively, memory cell 550 may optionally not include source/drain region 16 and 18, in which the as the regions 16 and 18 that would otherwise make up the source and drain regions are made of the same material, conductivity type and conductivity as the body 24 and therefore the source and drain regions 16 and 18 are left out of the body 24 and do not exist in such an embodiment.

Buried layer 22 may be formed by an ion implantation process on the material of substrate 12 with bit line implant mask 4. The bitline implant mask 4 may be a non-critical mask that opens only the memory cell 550 region. Alternatively, buried layer 22 can be grown epitaxially on top of substrate 12 or formed through a solid-state diffusion process. The body 24 of the first conductivity type is bounded on top by source 16, drain 18, and insulating layer 62 (or by surface 14 in general), on the sides by insulating layers 26 along A-A' direction, on the side by insulating layer 28 along B-B' direction, and on the bottom by buried layer 22. Body 24 may be the portion of the original substrate 12 above buried layer 22 if buried layer 22 is implanted. Alternatively, body 24 may be epitaxially grown on top of the buried layer 22 through a solid-state diffusion process. The body 24 may also be referred to as a fin in a FinFET technology.

A source 16 and drain 18 having a first or second conductivity type, such as n-type or p-type, for example, are provided in body 24, so as to bound a portion of the top of the body 24 in a manner discussed above, and is exposed at surface 14. If desired, the source 16 and drain 18 are not ion-implantation processed, so that they are left with the same material and conductivity type as that of the body 24. If desired, the source 16 and drain 18 may have, but not be limited to, the same conductivity type with the body 24. Source 16 and drain 18 may be formed by an implantation process on the material making up substrate 12, according to any implantation process known and typically used in the art. Alternatively, a solid-state diffusion or a selective epitaxial growth process could be used to form source 16 and drain 18.

A gate 60 is positioned in between the source 16 and the drain 18, above body 24. The gate 60 is insulated from the body 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides. The gates 60 may be patterned continuous along vertical direction (B-B' direction) as shown in FIGS. 25 and 27.

Insulating layers 26 (like, for example, shallow trench isolation (STI)), may be made of silicon oxide, for example, though other insulating materials may be used. Insulating layer 26 may be patterned by single diffusion break layer 8, given as a foundry's baseline process. Insulating layers 26 insulate memory cell 550 from adjacent memory cells 550 along the A-A' direction. The bottom of insulating layer 26 may reside inside the buried layer 22 allowing buried layer 22 to be continuous along horizontal direction (A-A' direction) as shown in FIG. 26. Insulating layer 28 (like, for example, shallow trench isolation (STI)), may be made of silicon oxide, for example, though other insulating materials may be used. Insulating layers 28, perpendicular to insulating layer 26, insulate memory cell 550 from adjacent memory cells 550 along the B-B' direction. The bottom of insulating layer 28 may reside below the buried layer 22 allowing buried layer 22 to isolate the buried layer 22 per body 24 along the B-B' direction as shown in FIG. 27. Consequently, the buried layer 22 formed through non-critical mask is self-aligned by insulating layers 26 and 28 and continuous along the horizontal direction. Therefore, the depth of the isolation layer 28 is deeper than the depth of the isolation layer 26, allowing the buried layer 22 to be continuous in the perpendicular direction of gate 60.

In one embodiment of this invention, the gate 60 in the vertical direction becomes wordline (WL) and the buried layer 22 in the horizontal direction becomes bitline (BL), forming a cross-point memory cell at each grid point, intersecting WL and BL. The orientation and terminology of WL and BL may be switched or the different terminology such as row and column can be used for WL and BL, interchangeably. The memory cell 550 includes terminals: word line (WL) terminal 70, bit line (BL) terminal 74, and substrate terminal (SUB) 78. WL terminal 70 is connected to gate 60. BL terminal 72 is connected to the buried layer 22. Substrate terminal 78 is connected to substrate 12 below buried layer 22. However, no physical connection to source/drain 16 and 18 is made to any terminals. At each grid point, the metal-insulator-semiconductor (MIS) dielectric capacitor is formed by gate 60, gate dielectric 62, and body 24. The term "metal" may include all conductive structure such as highly doped polysilicon. The doping concentration of n-type buried layer 22 could range from $1\times10^{18}/cm^3$ to $5\times10^{18}/cm^3$. The doping concentration of p-type body 24 could range from $1\times10^{16}/cm^3$ to $5\times10^{18}/cm^3$, and may be the same as the body doping concentration used in the n-type transistor on the same substrate.

As a result, each cross-section of WL and BL or each memory cell includes pn junction diode formed by the p-type body 24 and the n-type buried layer 22. The per-memory cell 550 diode serves as a select device of the cross-point memory structure preventing the flow of parasitic leakage current.

Figure 28:
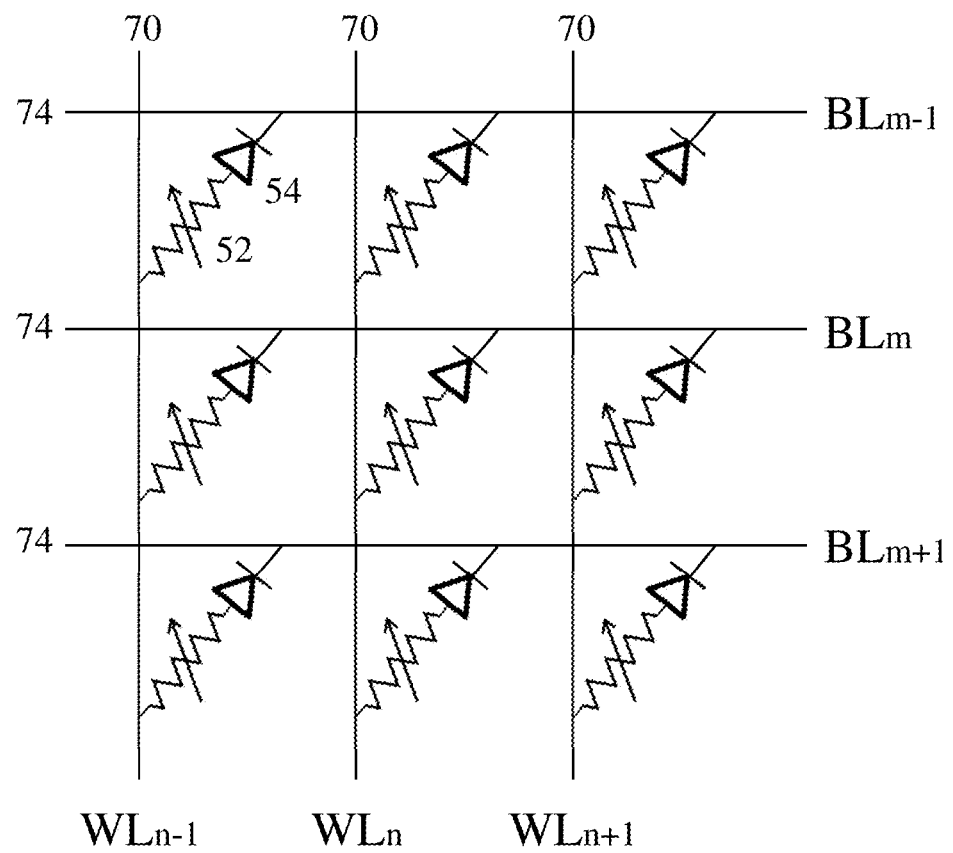
FIG. 28 is an equivalent circuit diagram of the memory array of FIG. 25.

Referring FIG. 28, an equivalent layout of the array 2150 of memory cells 550 of FIGS. 25-27 is shown. Memory cell 550 include gate dielectric antifuse 52 and pn junction diode 54. FIG. 29 shows example bias conditions for programming and read operations. The programing operation bias causes MIS oxide breakdown to the selected cells 550 but not to the unselected cells 550. The read operation bias senses the resistance or conductance of the selected cell 550 while minimizing the parasitic leakage current through unselected cells 550. In this example, the program voltage (Vp) and the read voltage (Vread) are selected by 3 V and 1 V, respectively. But those voltages are only example and their actual voltages depend on the technology and process. When the Vp and 0 V are applied across the selected wordline and selected bitline, respectively, its gate dielectric breaks down and the cell takes on a conductive state. For unselected cell 550, both unselected wordlines and bitlines are floating. The unselected cells are not disturbed. Alternatively, 0V and Vp are applied to unselected wordlines and bitlines, respectively. The half-selected cells (i.e. where only one of the WL or BL terminals is biased at a selected voltage while the other WL or BL terminals is biased at an unselected voltage) are at the same bias conditions across its wordline and bitline and no current flows. The unselected cells at the programmed states are under reverse biased condition and the leakage will be negligible. The read operation is similar to the write operation except that the read voltage is greater than the threshold voltage of pn junction diode such as 0.6 V and lower than the breakdown voltage used for the program operation.

The leakage current across BL to BL is minimized as the neighboring BLs form back-to-back pn diodes. The breakdown voltage of such parasitic npn structure (BL-substrate-BL) may be greater than 6 V.

FIGS. 30A-30C and 31 illustrate memory cell 650 having insulating layers 26 and 28 having different depths. Memory cell 650 is a bi-stable floating body device, for example as described in U.S. Patent Application Publication No. 2010/00246284 to Widjaja et al., titled "Semiconductor Memory Having Floating Body Transistor and Method of Operating" ("Widjaja-1"), U.S. Patent Application Publication No. 2010/0034041, "Method of Operating Semiconductor Memory Device with Floating Body Transistor Using Silicon Controlled Rectifier Principle" ("Widjaja-2"), U.S. Patent Application Publication No. 2012/0217549, "Asymmetric Semiconductor Memory Device Having Electrically Floating Body Transistor" ("Widjaja-3"), and U.S. patent application Ser. No. 13/746,523, "Memory Device Having Electrically Floating Body" ("Widjaja-4"), which are all hereby incorporated herein, in their entireties, by reference thereto.

Figure 30A:
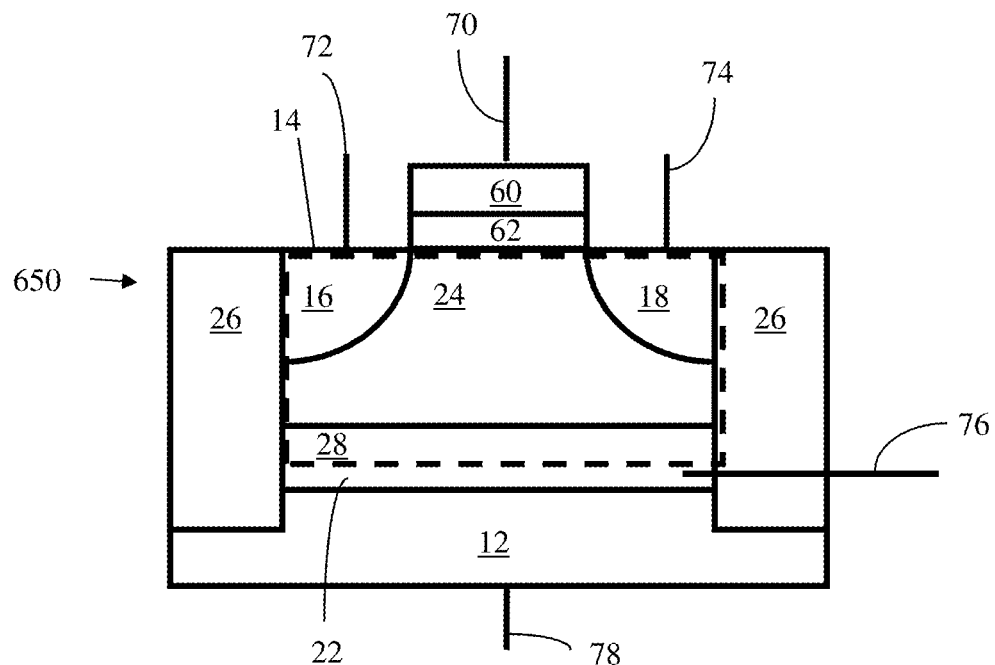
FIG. 30A is a schematic, cross-sectional illustration of a memory cell according to another embodiment of the present invention.
Figure 30B:
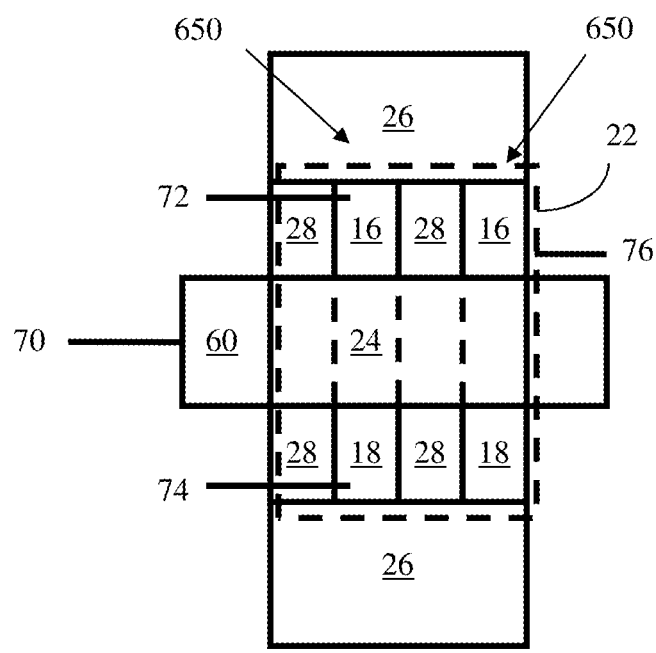
FIG. 30B is a schematic, top-view illustration of two memory cells of the type shown in FIG. 30A.
Figure 30C:
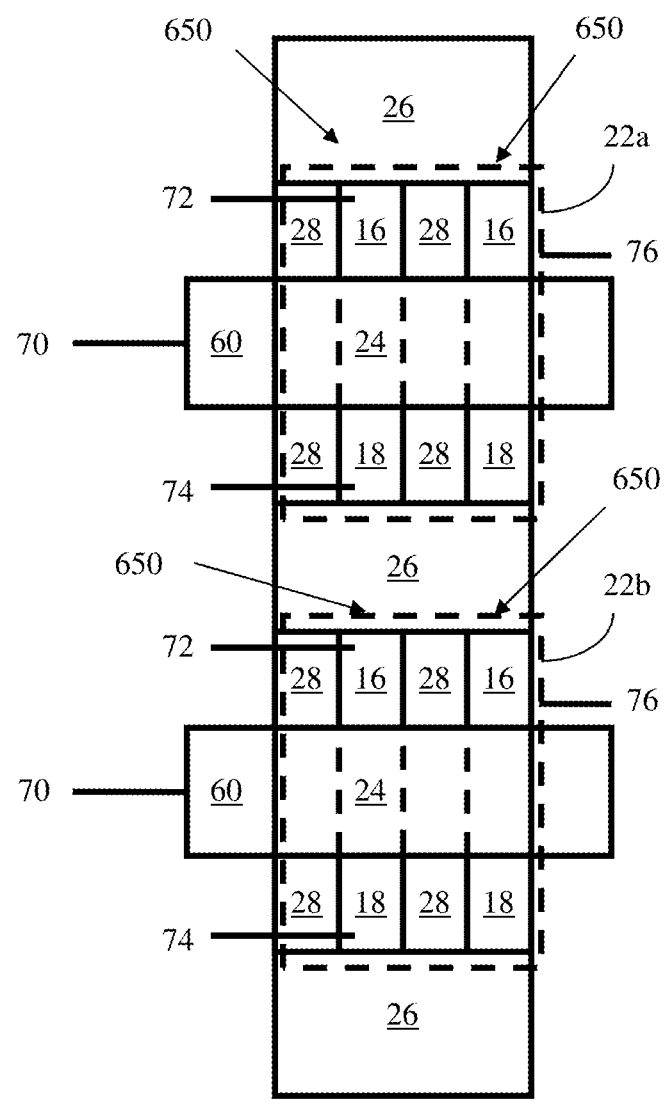
FIG. 30C is a schematic, top-view illustration of a 2×2 memory array of the memory cells of the type shown in FIG. 30A, such that two buried layer regions are isolated from one another by an insulating layer, according to an embodiment of the present invention.
Figure 31:
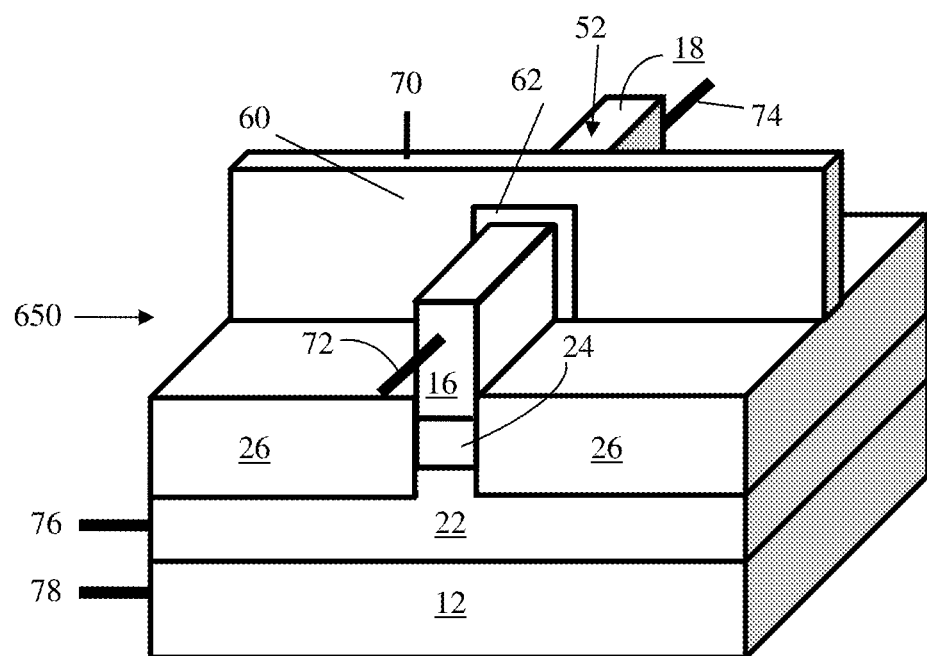
FIG. 31 is a schematic, three-dimensional view of a memory cell having a fin structure according to an embodiment of the present invention.

As illustrated in FIGS. 30A and 30B (shown better in FIG. 30A), the bottom of insulating layer 26 resides below the buried region 22. A shallower insulating layer 28 is provided which insulates the floating body region 24, but allows the buried layer 22 to be continuous in one direction, for example the perpendicular direction of the cross-sectional view shown in FIG. 30A. As a result, different bias conditions may be applied to different buried layer regions 22 isolated by the insulating layer 26. FIG. 30C illustrates two buried layer regions 22a and 22b isolated by insulating layer 26, which can be connected to different terminals and biased independently. Memory cell 650 may also comprise a fin structure as illustrated in FIG. 31.

Figure 32:
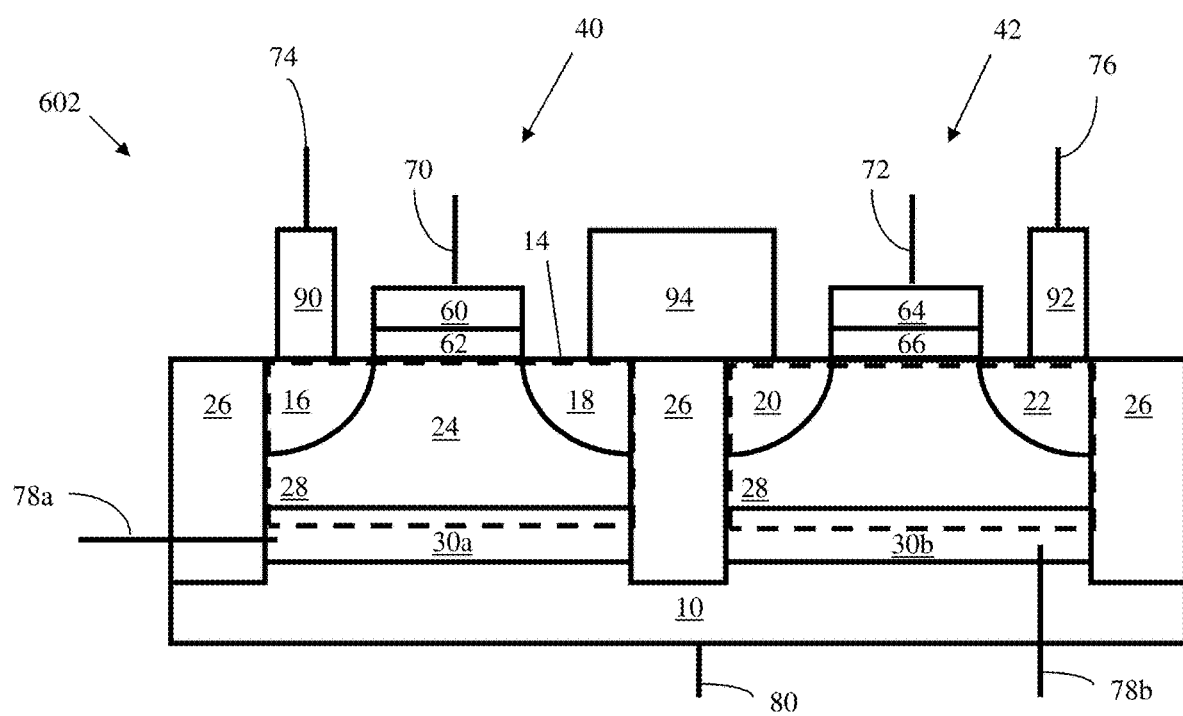
FIG. 32 schematically illustrates a memory cell having a memory transistor and an access transistor according to an embodiment of the present invention.

FIG. 32 illustrates memory cell 602 comprises memory device 40 and access device 42, which are connected in series, and has been described for example in U.S. application Ser. No. 14/380,779, "Memory Cell Comprising First and Second Transistors and Methods of Operating" ("Widjaja-5"), which is hereby incorporated herein, in its entirety, by reference thereto. Memory cell 602 comprises a floating body region 24 of a first conductivity type, such as p-type, for example; buried layer region 30a of a second conductivity type, such as n-type, for example.

Insulating layers 26 (like, for example, shallow trench isolation (STI)), may be made of silicon oxide, for example, though other insulating materials may be used. Insulating layers 26 insulate floating body transistor 40 from adjacent floating body transistor 40 and adjacent access transistor 42. The bottom of insulating layer 26 may reside inside the buried region 30a, 30b allowing buried region 30a, 30b to be continuous. Alternatively, the bottom of insulating layer 26 may reside below the buried region 30a, 30b as shown in FIG. 32. A shallower insulating layer 28 can be provided which insulates the floating body region 24, but allows the buried layer 30a, 30b to be continuous in one direction. As a result, different bias conditions may be applied to different buried layer regions 30a, 30b isolated by the insulating layer 26. FIG. 32 illustrates two buried layer regions 30a and 30b isolated by insulating layer 26, which can be connected to different terminals and biased independently. For example, about 0.0V may be applied to the buried layer region 30b of the access transistor 42, while about +1.2V may be applied to the buried layer region 30a of the floating body transistor 40.

From the foregoing it can also be seen that a memory cell having reduced operating voltage through the application of a back bias has been described. While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope of the invention as claimed.

That which is claimed is:

1. A method of selectively operating a semiconductor device as a memory select transistor with increased on-state drain current, said method comprising:
    providing said semiconductor device comprising a substrate having a first conductivity type selected from p-type conductivity type and n-type conductivity type; a buried layer having a second conductivity type selected from said p-type conductivity type and said n-type conductivity type and being different from said first conductivity type; a body having said first conductivity type; a source region and a drain region each having said second conductivity type and being separated by said body; and a gate positioned in between said source region and said drain region; wherein said semiconductor device is configured to function as a select transistor for at least one memory element connected to said drain region or said source region, wherein a state of said at least one memory element is determined by a resistivity of said at least one memory element; and
    selectively operating said semiconductor device as said semiconductor memory device or said transistor, wherein said selectively operating comprises:
    applying a relatively low voltage to said buried layer to operate said semiconductor device as said memory select transistor wherein said memory select transistor operates as an ordinary memory select transistor with a first amount of on-state drain current;
    applying a relatively high voltage to said buried layer to operate said semiconductor device as said semiconductor memory device, wherein said semiconductor memory device has at least two stable states; and
    applying an intermediate high voltage higher than said relatively low voltage but lower than said relatively high voltage to said buried layer to operate said semiconductor device as said memory select transistor with increased on-state drain current, relative to said first amount of on-state drain current.

2. The method of claim 1, wherein said relatively high voltage is sufficiently high to turn on a vertical bipolar junction transistor (BJT) formed by said buried layer, said body and one of said source region or said drain region.

3. The method of claim 2, wherein said turn on of said vertical BJT acts as a base current for a lateral BJT formed by said source region, said body and said drain region, turning on said lateral BJT and resulting in increased on-state drain current.

4. The method of claim 1, wherein said intermediate high voltage summed with a voltage applied to said gate is sufficiently high to turn on a vertical bipolar junction transistor (BJT) formed by said buried layer, said body and one of said source region or said drain region.

5. The method of claim 4, wherein said turn on of said vertical BJT acts as a base current for a lateral BJT formed by said source region, said body and said drain region, turning on said lateral BJT and resulting in increased on-state drain current.

6. The method of claim 1, further comprising governing an amount of on-state drain current enhancement of said semiconductor device functioning as said memory select transistor connected to at least one memory element, by an amount of voltage applied to said buried layer.

7. The method of claim 4, wherein an off-state current, when said intermediate high voltage is applied, is the same as when zero voltage is applied to said buried layer.

8. The method of claim 1, comprising applying zero voltage to said gate and applying said intermediate high voltage to said drain region, resulting in turning off a MOS transistor formed by said source region, said gate, said drain region and said body; and turning on a lateral bipolar junction transistor (BJT) formed by said source region, said body and said drain region.

9. The method of claim 8, comprising switching between on and off of said MOS transistor by controlling an amount of voltage applied to said gate.

10. The method of claim 1, further comprising providing a charge trap layer containing a substantial number of charge trap centers that may absorb excess majority carrier.

11. The method of claim 1, further comprising providing a buried layer tap connected to said buried layer.

12. The method of claim 1, further comprising providing a metal silicide junction located at at least one of: a location between said source region and said body, and a location between said drain region and said body.

13. The method of claim 1, further comprising providing an energy band offset region located at at least one of: a location between said source region and said body, and a location between said drain region and said body.

14. The method of claim 1, further comprising providing a recombination center located at at least one of: a location between said source region and said body, and a location between said drain region and said body.

15. The method of claim 1, wherein said at least one memory element comprises resistive switching memory (RRAM), phase change memory (also known as PCM, PRAM, PCRAM), Chalcogenide memory (CRAM), or magnetoresistive memory (MRAM).

16. The method of claim 1, wherein at least two of said memory elements are connected to one said memory select transistor for 1T-nM architecture.

17. The method of claim 16, wherein said at least two memory elements are three-dimensionally stacked.

* * * * *